United States Patent [19]
Azar

[11] Patent Number: 5,957,194
[45] Date of Patent: Sep. 28, 1999

[54] PLATE FIN HEAT EXCHANGER HAVING FLUID CONTROL MEANS

[75] Inventor: Kaveh Azar, Westwood, Mass.

[73] Assignee: Advanced Thermal Solutions, Inc., Newton, Mass.

[21] Appl. No.: 08/673,802

[22] Filed: Jun. 27, 1996

[51] Int. Cl.[6] .............................. F28F 7/00; H05K 7/20
[52] U.S. Cl. .................. 165/80.3; 165/185; 174/16.3; 257/722; 361/692; 361/703; 361/704
[58] Field of Search .................. 165/80.3, 185; 174/16.3; 257/722; 361/691, 703, 704, 707, 709, 710, 692

[56] References Cited

U.S. PATENT DOCUMENTS

| | | |
|---|---|---|
| 3,217,793 | 11/1965 | Coe . |
| 3,313,340 | 4/1967 | Dubin ..................................... 165/80.3 |
| 3,457,988 | 7/1969 | Meyerhoff et al. . |
| 4,296,455 | 10/1981 | Leaycraft et al. ....................... 361/691 |
| 4,535,384 | 8/1985 | Wakabayashi et al. ............. 165/80.3 X |
| 4,765,397 | 8/1988 | Chrysler et al. . |
| 4,953,634 | 9/1990 | Nelson et al. . |
| 5,020,586 | 6/1991 | Mansingh . |
| 5,040,596 | 8/1991 | Terasaki et al. ..................... 165/185 X |
| 5,077,601 | 12/1991 | Hatada et al. ........................... 257/722 |
| 5,168,348 | 12/1992 | Chu et al. . |
| 5,241,452 | 8/1993 | Kitajo . |
| 5,304,845 | 4/1994 | Lindquist et al. ....................... 257/722 |
| 5,304,846 | 4/1994 | Azar et al. . |
| 5,381,859 | 1/1995 | Minakami et al. . |
| 5,437,328 | 8/1995 | Simons ............................... 165/185 X |
| 5,486,980 | 1/1996 | Jordan et al. . |
| 5,542,176 | 8/1996 | Serizawa et al. .................... 165/185 X |
| 5,763,950 | 6/1998 | Fujisaki et al. ..................... 165/80.3 X |

FOREIGN PATENT DOCUMENTS

| | | | |
|---|---|---|---|
| 612105 | 8/1994 | European Pat. Off. . | |
| 623952 | 11/1994 | European Pat. Off. . | |
| 190048 | 12/1985 | Japan . | |
| 204498 | 8/1989 | Japan | ..................................... 361/702 |
| 47895 | 2/1990 | Japan | ..................................... 361/704 |
| 267547 | 9/1992 | Japan | ..................................... 257/722 |
| 291750 | 10/1992 | Japan | ..................................... 257/722 |
| 698214 | 10/1953 | United Kingdom | ................... 165/185 |

OTHER PUBLICATIONS

Horvath et al., "Metal Cooling Fins For a Semiconductor Package", IBM Technical Disclosure Bulletin, vol. 26, No. 7A, pp. 3233–3234, Dec. 1983.

Author Unknown, "Non–Uniform Fin Shapes of Modules in Air–Cooled Environments", IBM Technical Disclosure Bulletin, vol. 28, No. 6, Nov. 1985.

Electronic'90 Hauptkatalog, Conrad Electronic, Hirschau, Germany, 1990, 494.

Author unknown, "Perforated Metal Fins", Research Disclosure, Jan. 1991, No. 321.

*Primary Examiner*—Leonard Leo
*Attorney, Agent, or Firm*—Lieberman & Brandsdorfer, LLC

[57] ABSTRACT

A heat exchanger is disclosed for dissipating heat from a heat generating component. The heat exchanger comprises a thermally conductive base in thermal communication with the component, a plurality of thermally conductive plate fins affixed to the base wherein the plate fins define a fin field and channels, and fluid control means for controlling the fluid flow within the fin field. In one embodiment, the fluid control means utilizes the low pressure created by flow bypass to vent relatively high pressure fluid within the fin field. Alternatively or in conjunction, the fluid control means substantially prevents premature egress of fluid from the top of the fin field caused by the high pressure region within the fin field.

26 Claims, 32 Drawing Sheets

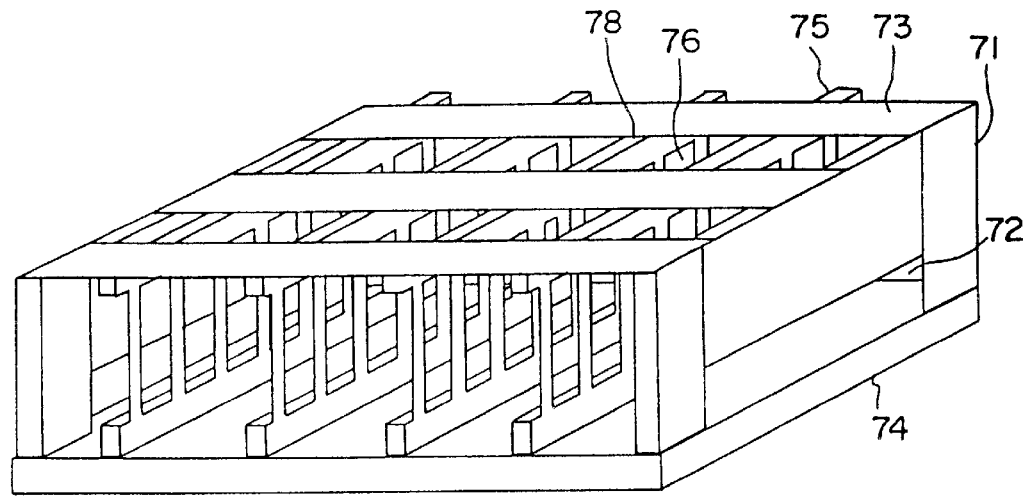
FIG. 7A
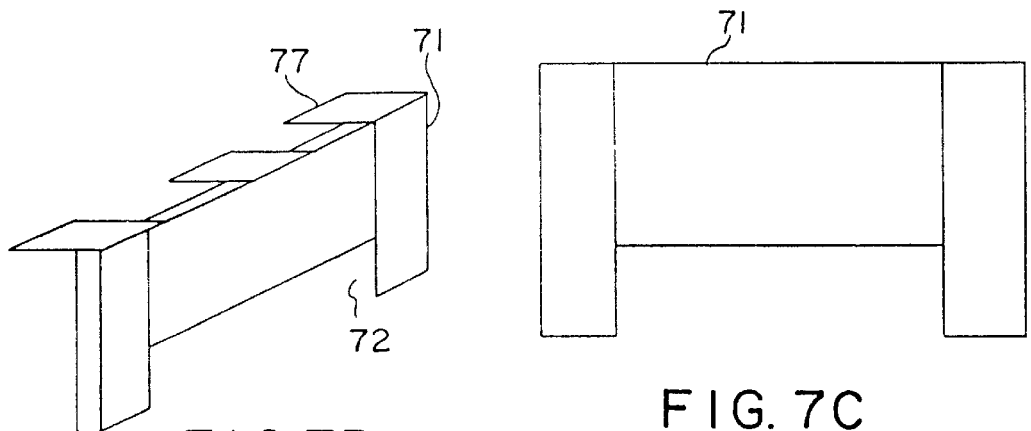
FIG. 7B
FIG. 7C

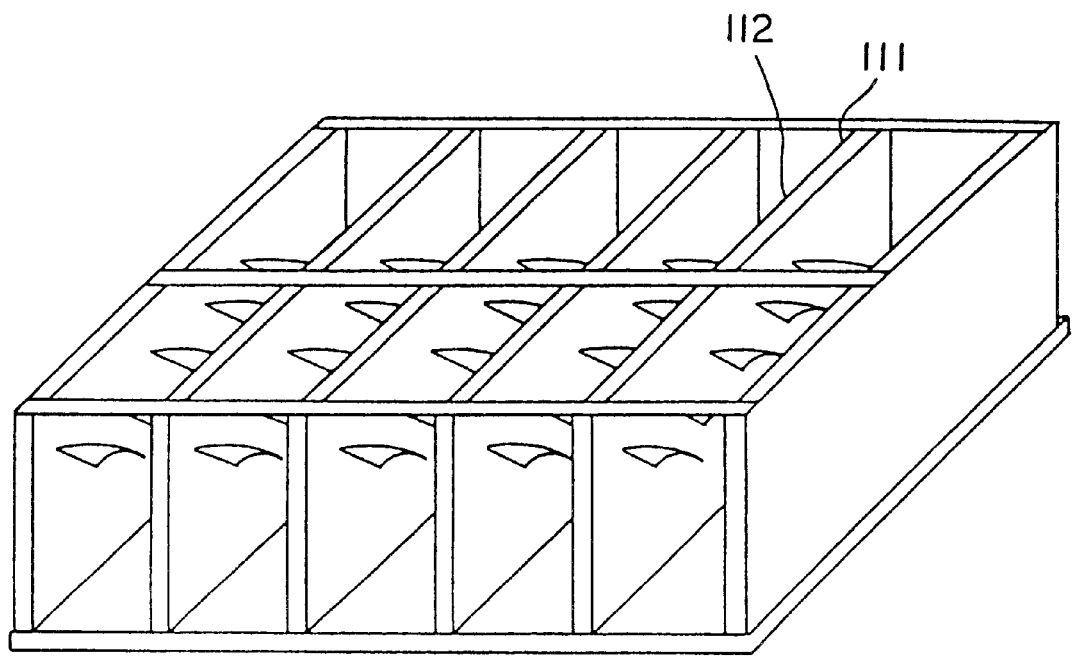
F I G. 11A
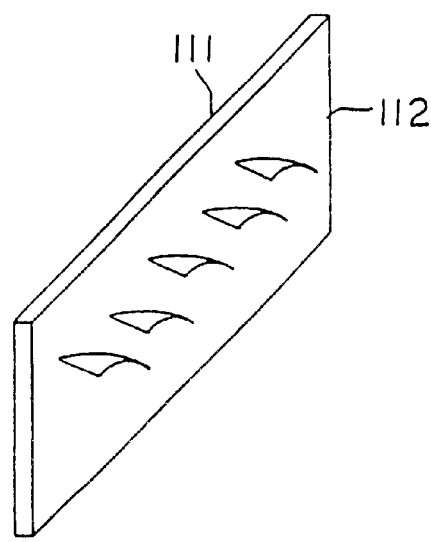
F I G. 11B

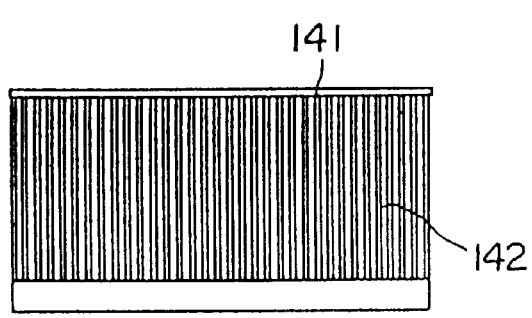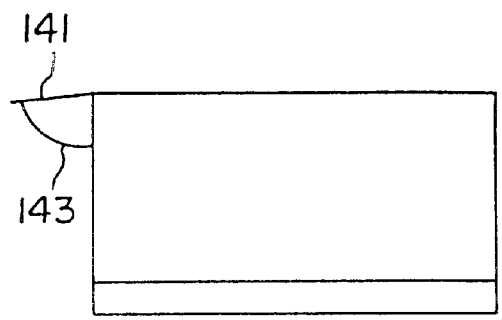
FIG. 14A  FIG. 14B
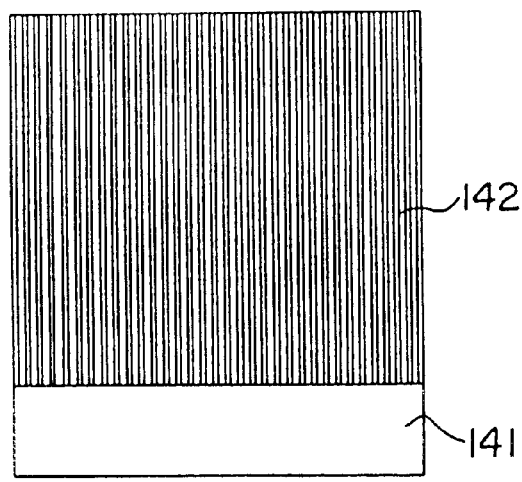
FIG. 14C

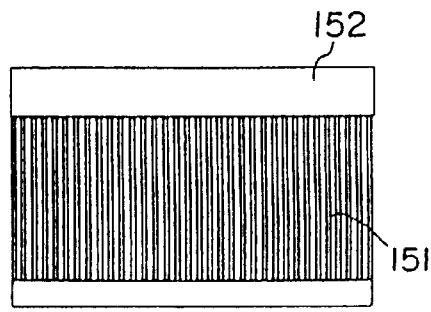
F I G. 15A
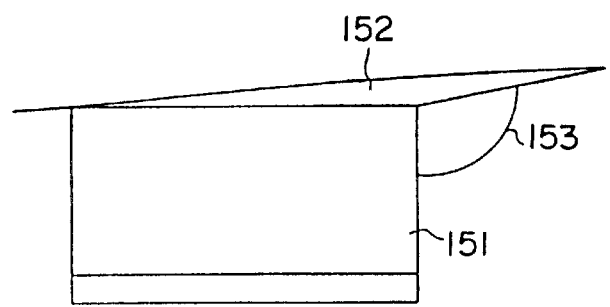
F I G. 15B
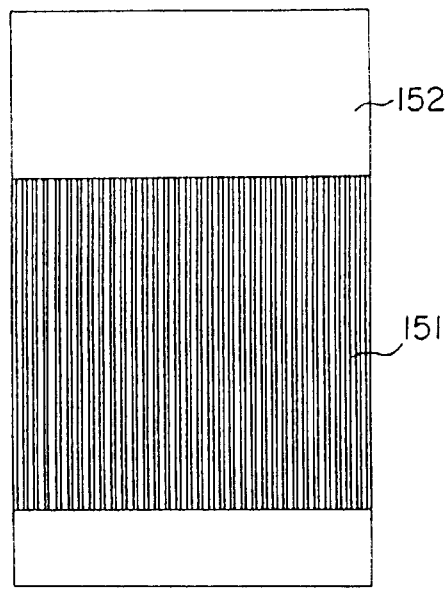
F I G. 15C

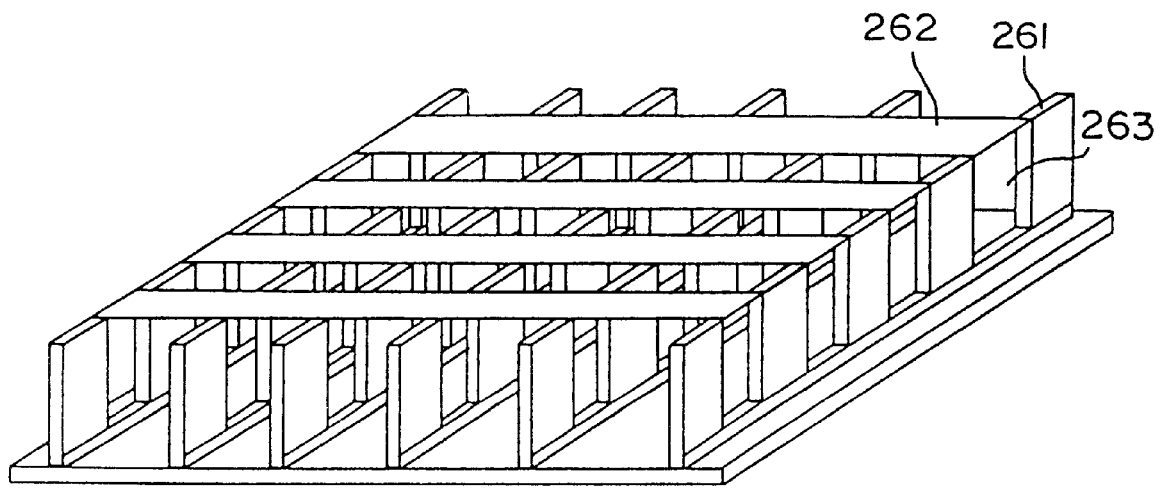
FIG. 26A
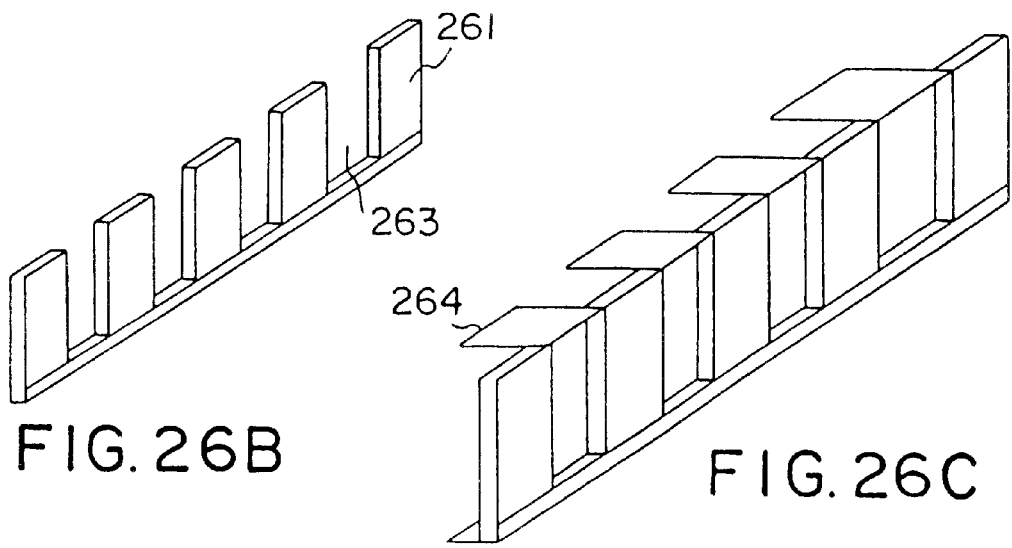
FIG. 26B
FIG. 26C

PLATE FIN HEAT EXCHANGER HAVING FLUID CONTROL MEANS

BACKGROUND OF THE INVENTION

This invention relates generally to the cooling of heat-producing electronic components and, more particularly, to a heat exchanger having fluid control means for deterring the formation of high pressure within the heat exchanger and/or reducing the premature egress of fluid from the heat exchanger caused by the high pressure.

Effective dissipation of heat produced by electronic components is an important concern in optimizing circuitry performance. In addition to optimizing performance, effective heat dissipation also helps to prolong the useful life of those components. Heat dissipation is particularly important in the case of high-power electronic components, such as microprocessors and lasers, which generate a relatively high amount of heat in a relatively small area.

Finding suitable heat exchangers to adequately dissipate the heat generated by these components is a difficult task. These components are typically used in systems housed within a cabinet having a fan mounted in the back. The fan pulls cooling fluid, usually air, across the electrical components mounted within. A suitable heat exchanger should function adequately given this environment. Exotic methods of cooling high-power electronic components, such as forced liquid cooling, are undesirable due to the high cost of implementation and maintenance in these systems. Given their relative simplicity, traditional plate fin heat exchangers are generally preferred from cost and implementation perspectives. These exchangers offer high surface area for heat exchange relative to their size. Nevertheless, often these devices are inadequate to dissipate heat generated from high power electronics, although improvements are being made.

Advances have been made involving the use of narrow channel and micro-channel plate fin heat exchangers to cool electronic components. For example, a patent issued to the applicant, Azar et al., U.S. Pat. No. 5,304,846, discloses a narrow-channeled heat exchanger with certain geometric relations aimed at improving the heat dissipation of the heat exchanger. Specifically, the patent teaches optimal ratios relating the height of the plate fins to the width of the channels. The ratios can be selected to optimize the heat dissipation capabilities of the heat exchanger for a given pressure drop across the heat exchanger.

Although narrow channel heat exchangers significantly improve heat dissipation, they, like all other plate fin designs, suffer from boundary layer formation. The boundary layer consists of hydrodynamic and thermal layers which result from friction or drag between cooling fluid and a plate fin. The layer tends to blanket the plate fin thereby insulating it from the cooler fluid flow. This reduces heat transfer. Additionally, the layer narrows the remaining channel available to fluid flow which further impedes fluid flow thereby compounding the problem. The boundary layer therefore thickens as the fluid progresses down the channel contributing to high pressure within the fin field.

Efforts to reduce boundary layer formation in heat exchangers include irregularities such as protrusions, indentations and louvers along the plate fin surface. These irregularities are intended to disturb the boundary layer to prevent it from building up. From the standpoint of boundary layer disruption, the greatest improvement would be a device having as many irregularities as possible. Unfortunately, however, such an approach leads to practical problems. First, it is difficult, if not impossible, to extrude a plate fin having the desired surface irregularities. Extrusion techniques are limited to producing lengthwise ridges (horizontal and vertical) which have limited ability to disrupt the boundary layer. Other manufacturing techniques such as casting and machining also preclude intricate plate fin textures. Perhaps more important though, increasing irregularities, as described above, also decreases the velocity of the passing fluid within the channels formed by the textured plate fins which tends to increase pressure within the fin field.

The applicant has found that high pressure in the fin field leads to inefficient heat transfer and premature egress of fluid from the fin field. Therefore, a need exists for a flat fin heat exchanger that deters high pressure formation, prevents the premature egress of fluid from the fin field caused by the high pressure, and/or minimizes boundary layer formation without increasing pressure. The present invention fulfills this need.

SUMMARY OF THE PRESENT INVENTION

The present invention is directed at an improved heat exchanger for dissipating heat from a heat generating component. The heat exchanger comprises a thermally conductive base in thermal communication with the component, a plurality of thermally conductive plate fins affixed to the base wherein the plate fins define a fin field and channels, and fluid control means for controlling the flow of fluid within the fin field to minimize the formation of high pressure. Alternatively or in conjunction, the fluid control means substantially prevents premature egress of fluid from the top of the fin field caused by the high pressure within the fin field.

One preferred embodiment of the invention utilizes the low pressure created by flow by-pass to vent relatively high pressure fluid within the fin field. To this end, the fluid control means comprises fluid communication means between a portion of the channels and at least one side of the fin field. The fluid communication means enables a portion of fluid within the fin field to be drawn out by the low pressure caused by the flow by-pass. In this way, the formation of high pressure within the fin field is substantially avoided. Suitable fluid communication means in this embodiment include slots, notches, orifices, or perforations through a fin, gaps or spaces along a plate fin, and combinations thereof.

In another preferred embodiment, the fluid control means comprises flow guide means within the fin field. The flow guide means are configured to impart a downward force to a portion of fluid within the fin field to hamper its premature exit out the top. Suitable flow guide means include vanes protruding from the plate fins, bars traversing the top of the fin field, and combinations thereof.

The present invention therefore provides for an improved heat exchanger configuration that enhances fluid flow through the fin field to improve heat dissipation efficiency.

BRIEF DESCRIPTION OF THE DRAWINGS

The features of the present invention, which are believed to be novel, are set forth with particularity in the appended claims. The invention may best be understood by reference to the following description taken in conjunction with the accompanying drawings, wherein like reference numerals identify like elements, and wherein:

FIGS. 5–33 show various embodiments of the present invention; and

DETAILED DESCRIPTION OF THE PRESENT INVENTION

In this disclosure, the term "fin" (also called a "plate" or "flat fin") refers to a substantially planar heat exchanging member that extends at an angle, typically about 90 degrees, from a base. Such a base may support a number of plate fins, in which case, "channels" are defined between adjacent fins. The area within and immediately about the cluster of plate fins is referred to as the "fin field." It should be understood that the term "fluid" as used herein refers to both liquids and gases. The flow of fluid across the fin field can be created using known means such as fans and natural convection.

Figure 1:
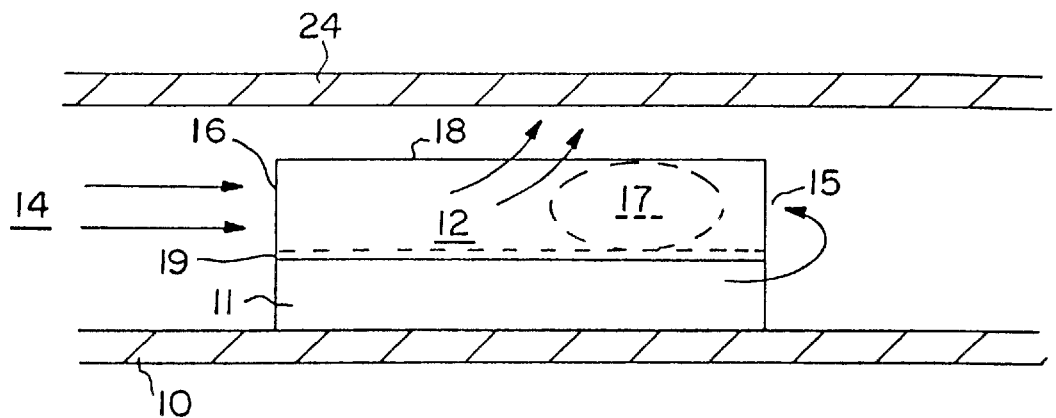
FIG. 1 shows a side view of a prior art heat exchanger.
Figure 2:
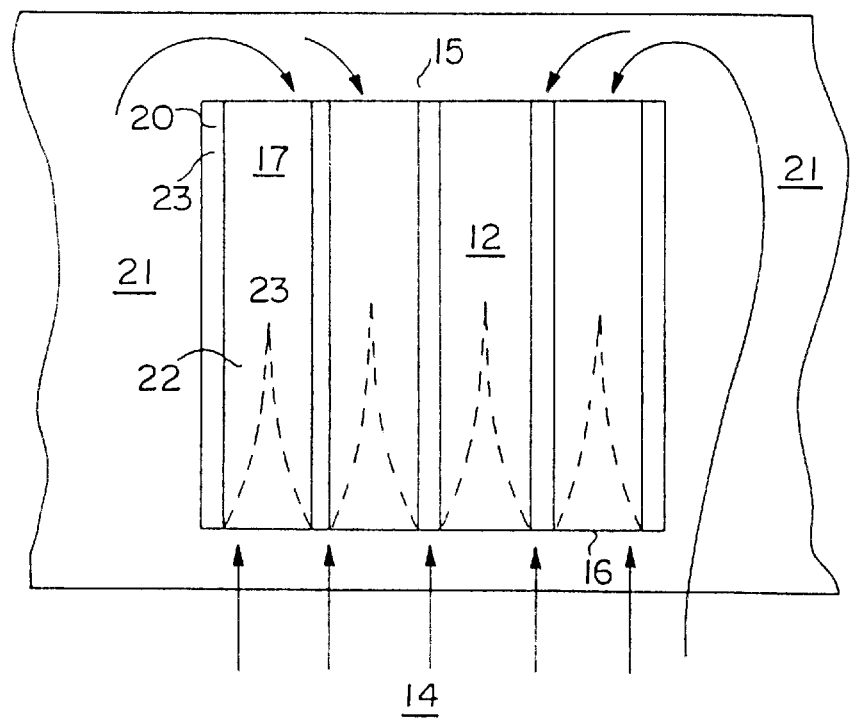
FIG. 2 shows a top view of the prior art heat exchanger in FIG. 1.

Referring now to the drawings, FIGS. 1 and 2 show a prior art configuration of a heat generating component 11 mounted to a printed circuit board (PCB) 10 and adjacent to another PCB 24. A prior art heat exchanger having individual plate fins 20 affixed to a base 19 is mounted to the component 11. The plate fins 20 define a fin field 12, and channels 23 through which cooling fluid 13 flows. The fin field 12 has a top 18, and intake and exhaust regions 16, 17 respectively.

The combination of the heat generating component and the heat exchanger forms a 3-dimension protrusion into the flow of fluid 14. As such, the prior art heat exchanger experiences certain fluid dynamics which reduce its effectiveness, including boundary layer formation, high pressure formation, and premature fluid egress form the fin field.

Cooling fluid 13 entering the fin field through the channels 23 forms a boundary layer 22 along the sides of the plate fins as shown in FIG. 2. The boundary layer is a region of heated, high pressure fluid that forms as a result of the friction between the plate fin 20 and fluid. The layer tends to blanket the plate fin thereby insulating it from the cooler fluid flow. This reduces heat transfer. Additionally, the layer narrows the remaining channel available to fluid flow which further impedes fluid flow, thus, compounding the problem. As shown in FIG. 2, the boundary layer 22 grows as the fluid 13 progresses down the channel, eventually contributing to a region 17 of near stagnant, high pressure fluid within the fin field.

Fluid not only penetrates the fin field 12 and forms boundary layers, but also flows over and around it. Fluid flowing over and around the fin field 12 is referred to as "flow by-pass" in this disclosure. Flow by-pass typically reduces the efficiency of the fin field 12. Specifically, fluid 21 flows around the heat exchanger 12 (see FIG. 2), turns and enters it from the exhaust region 15. This also contributes to the near stagnant, high pressure region 17 within the fin field 12. This problem is exacerbated because the by-pass fluid contributing to the high pressure region 17 comprises relatively hot fluid. That is, this fluid travels around the fin field 12 in intimate contact with the PCB. The PCB carries much of the heat generated by the components mounted thereto, and consequently, the passing fluid is heated.

The high pressure caused by flow by-pass and boundary layer formation impedes the fluid flow 13 through the fin field 12 and contributes to its premature egress through the field's top 18. Consequently, relatively cool fluid entering through the intake region 16 of the fin field 12 is forced from the field. Thus, the high pressure not only blankets the region in a hot layer that retards efficient heat transfer, but also forces the relatively cool fluid to leave the fin field prematurely.

The present invention recognizes the phenomena leading to the formation of high pressure within the fin field and its effects, and provides solutions aimed at preventing high pressure from forming, and/or reducing its effects. In its basic embodiment, the present invention provides for an improved heat exchanger for dissipating heat from a heat generating component. The heat exchanger comprises a thermally conductive base in thermal communication with the component. Affixed to the base is a plurality of thermally conductive plate fins. The plate fins define a fin field having channels, a top, sides, an intake region, and an exhaust region. The invention provides for fluid control means for controlling fluid flow within and around the fin field to perform the following functions:

(1) deter the formation of high pressure fluid;
(2) reduce the premature egress of fluid from the top of the fin field caused by high pressure fluid; and/or
(3) minimize boundary layer formation without forming high pressure fluid.

1. Deter High Pressure Formation

The present invention deters the formation of high pressure by (a) venting the high pressure and/or (b) minimizing the friction between the plate fin and the cooling fluid.

a. Venting

In a preferred embodiment, the flow control means comprises ventilation means to alleviate high pressure fluid within the fin field and enhance the performance of the heat exchanger. The ventilation means actually exploits the flow by-pass to achieve this function. Fluid by-passing the fin field must travel a greater distance in the same time as the fluid passing directly through the fin field. Consequently, its velocity must increase. According to Bernoulli's principle, a decrease in pressure accompanies an increase in speed. A region of low pressure therefore covers the top and lines the sides of the fin field. Although this low pressure contributes to the premature egress of fluid from the fin field, it can also be harnessed to improve heat exchanger performance. The present invention uses the low pressure to draw the high pressure fluid from the fin field.

The ventilation means can include fluid communication means between a portion of the channels and at least one side of the fin field. The fluid communication means enables a portion of fluid within the fin field to be drawn out by the low pressure flow by-pass. The fluid communications means may include a plurality of passageways within the fin field. These passageways can be slots or notches within a plate fin, gaps along a plate fin, perforations or orifices in a plate fin, and the like, and combinations thereof. Alternatively, the passageways may comprise traversing tubes or channels above or below the fin field.

Yet another ventilation means involves the radial configuration of plate fins such that a portion of the channels between the plate fins has access to the side of the fin field. This enables a portion of fluid within the fin field to be drawn out by the low pressure through the channels. Still other ventilation means may be obvious to someone skilled in the art once the stagnation problem and venting solution are understood.

b. Minimizing Friction

In another embodiment, the fluid control means can reduce high pressure by minimizing the friction between the plate fins and the fluid. A tapered plate fin, for example, provides for reduced friction. The taper of the plate fin is designed such that the plate fin's cross-sectional area relative to the direction of the fluid flow decreases from the intake region to the exhaust region. Less cross-sectional area corresponds to less friction or drag, and thus, less reduction in fluid velocity. Alternatively, the plate fins may be coated to reduce friction. As mentioned above, drag is a major contributor to the boundary layer condition which contributes greatly to high pressure within the fin field. Therefore, by reducing drag, the present invention reduces the formation of high pressure.

2. Prevent Premature Egress

In another embodiment, the fluid control means prevents the premature egress of fluid from the top of the fin field caused by the high pressure region within the fin field and by the low pressure by-pass above it. One way to perform this function is through the use of flow guide means within the fin field. Aside from improving heat transfer by increasing the plate fins' surface area, the flow guide means are configured to impart a downward force to a portion of the fluid within the fin field thereby hampering its premature exit from the top of the fin field. The flow guide means can be a mechanism such as a vane protruding from a plate fin, a bar traversing the tops of a portion of the plate fins, and combinations thereof. The vanes can have various configurations such as arcuate or straight, integral to the plate fin or discrete and separately attached. In one preferred embodiment, the vane comprises a disrupted section of the plate fin that is bent to protrude from the plate fin. The bar too can assume a variety of configurations. Suitable configurations include a flat bar, a profiled bar, and a profiled bar having a point(s). In this context, the term "profiled" refers to a significant profile or cross-sectional area relative to the flow of the fluid. Other suitable mechanisms will be obvious to someone skilled in the art once the problem of premature egress is understood, and the ability to curb it through fluid redirection is realized.

The use of a bar not only exerts a downward force on a portion of fluid within the fin field, but also imparts other improvements to the heat exchanger. The profiled bars retard fluid flow above the fin field thereby forming a high pressure region. Such a high pressure region substantially prevents a portion of fluid from prematurely exiting the fin field, and may even present a pressure gradient significant enough to cause ingress of fluid through the fin field's top. Moreover, by using bars to cover a significant portion of the fin field top and restrict the region of fluid egress, fluid enters the fin field at a higher velocity and at an angle nearly normal to the base. This creates a near impingement condition which is highly desirable in heat exchangers.

3. Minimize Boundary Layer Formation

The flow control means can also be used to reduce boundary layer formation by fin surface enhancements such as texturing or other surface anomalies. The texturing causes eddy currents in the fluid flow that disrupt the boundary layer. Unfortunately, surface irregularities also decrease fluid velocity which increases pressure. It is therefore preferred that the fluid control means for deterring the formation of high pressure within the fin field be used in combination with such texturing or surface anomalies.

Comparative Illustration

Figure 3:
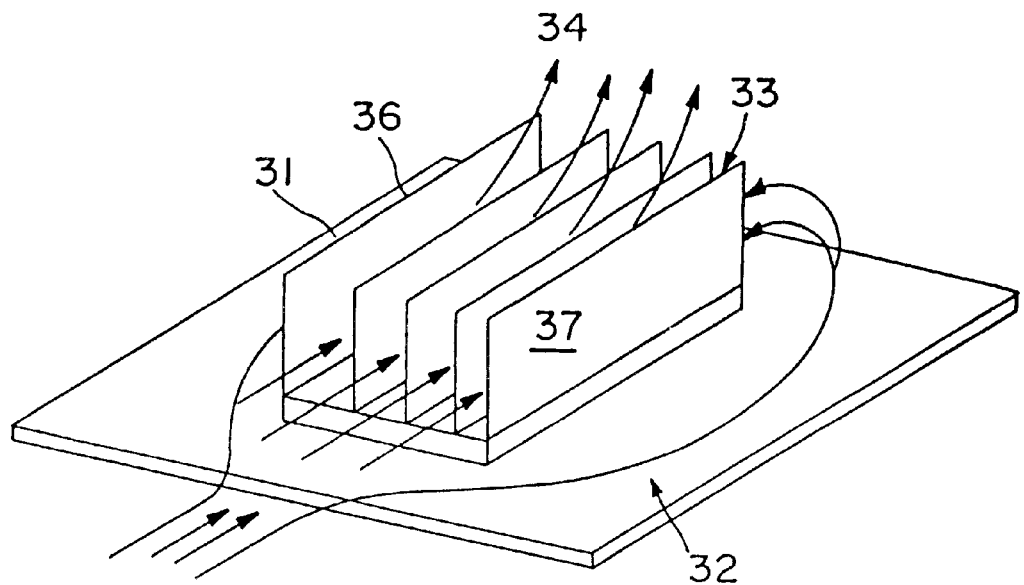
FIG. 3 shows a perspective view of the fluid dynamics associated with a prior art heat exchanger.
Figure 4:
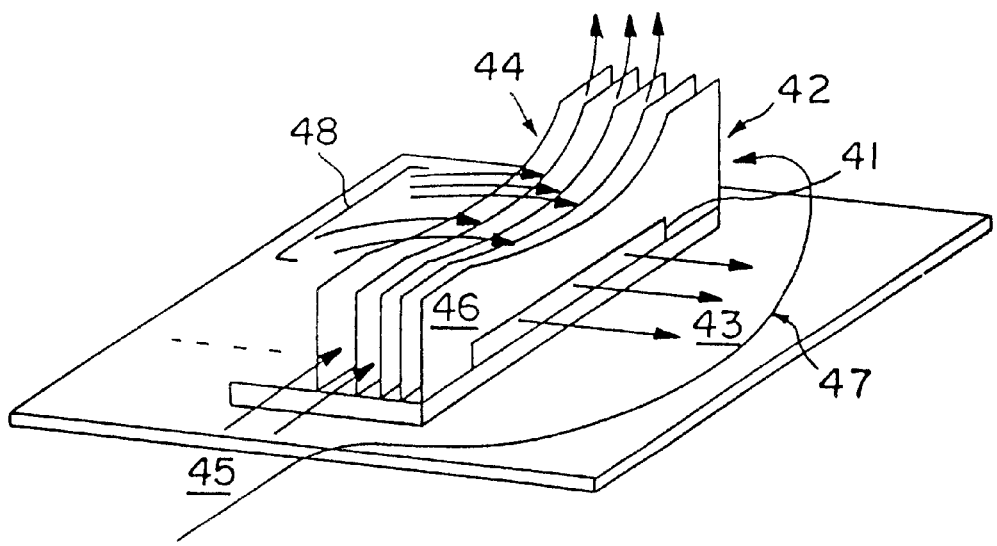
FIG. 4 shows a perspective view in comparison to FIG. 3 of the present invention's heat exchanger and its associated fluid dynamics.

The improvements of the present invention can be more readily understood in comparison to the prior art under dynamic fluid conditions. FIG. 3 shows a perspective view of a typical heat exchanger 31 and its attendant problems of fluid by-pass 32 including stagnation 33 and premature egress 34 from the top 36 of the fin field 37. On the other hand, FIG. 4 shows one possible combination of fluid control means. Slots 41 in a plate fin 42 provide ventilation means to the low pressure region 43 caused by the flow by-pass 47. Additionally, tapered plate fins 44 reduce the friction with the fluid 45 entering the fin field 46 thereby reducing the velocity drop and minimizing pressure increase. The combination of the ventilation means and tapered plate fins serves to minimize the formation of a high pressure region within the field. By reducing high pressure formation, the premature egress of fluid 47 from the fin field 46 is also minimized if not reversed. That is, the fluid control means even tends to draw cool fluid 48 through the top of the fin field 46. The result of these control means is a high performance heat exchanger that dissipates heat more efficiently than the prior art.

Specific Embodiments

Referring to FIGS. 5–33, specific embodiments of the present invention will now be considered in light of the principles above. These embodiments depict various configurations of the fluid control means for (1) deterring the formation of high pressure, (2) reducing premature egress of fluid from the field, and/or (3) minimizing boundary layer formation. It should be understood that the particular flow control means illustrated by these figures should not be construed to limit the scope of invention, and may be interchanged and varied to form infinite combinations.

Figure 5A:
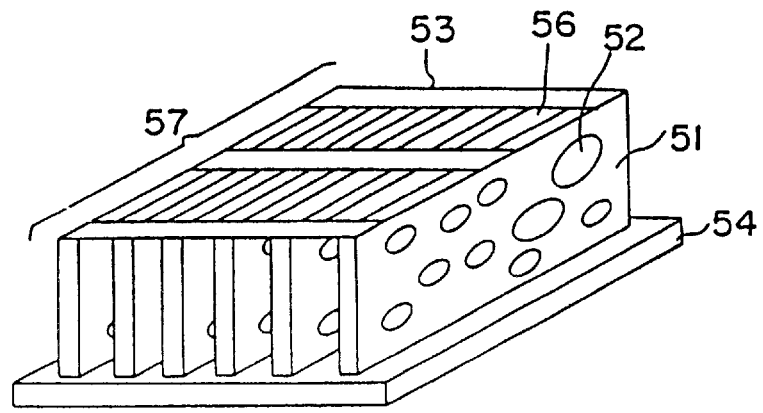
Figure 5B:
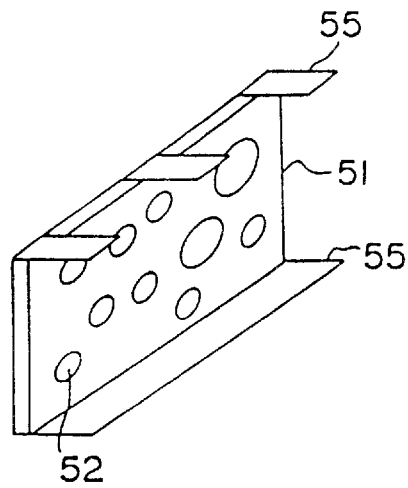
Figure 5C:
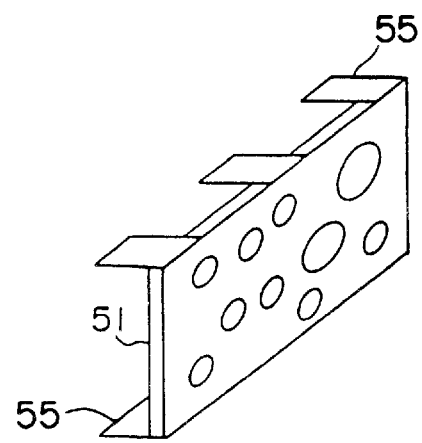

FIG. 5 shows a heat exchanger having a series of plate fins 51 with holes or perforations 52. The plate fins 51 are mounted to a base 54, and are further secured with bars 53 that traverse the plate fins across their top. It should be understood that such bars are optional in this embodiment as well as in the other embodiments disclosed herein. The plate fins 51 define channels 56 therebetween, and a plate fin field 57 and about. FIG. 5b depicts a discrete plate fin 51 that can be configured according to a particular application before being mounted to the base 54. The discrete plate fin 51 has connection means 55 for securing to the base 54 and to other plate fins. In one embodiment, when a series of discrete plate fins are mounted to the base, as shown in FIG. 5a, the connection means 55 on the top align and form the individual bars 53. FIG. 5c shows a complementing plate fin 51 having support means 55 protruding from an opposite side which may be used as a side plate fin to complete the heat exchanger.

The bars 53 not only add structural integrity to the assembly, but also act as flow control means, specifically, flow guide means for imparting a downward force on the fluid attempting to exit. Additionally, the perforations 52 in the plate fins 51 provide fluid communication means between the channels 56. This fluid communication ventilates the stagnant region within the fin field 57. Specifically, low pressure along the sides of the fin field (caused by the flow bypass as described above) draws fluid from the fin field 57 through the perforations 52. Additionally, these perforations allow for omni-directional fluid flow. That is, the alignment of the fin field is no longer crucial since fluid can flow either through the channels or across the channels. In the latter case, the channels provide the ventilation means to the region of low pressure caused by the fluid by-pass.

Figure 6A:
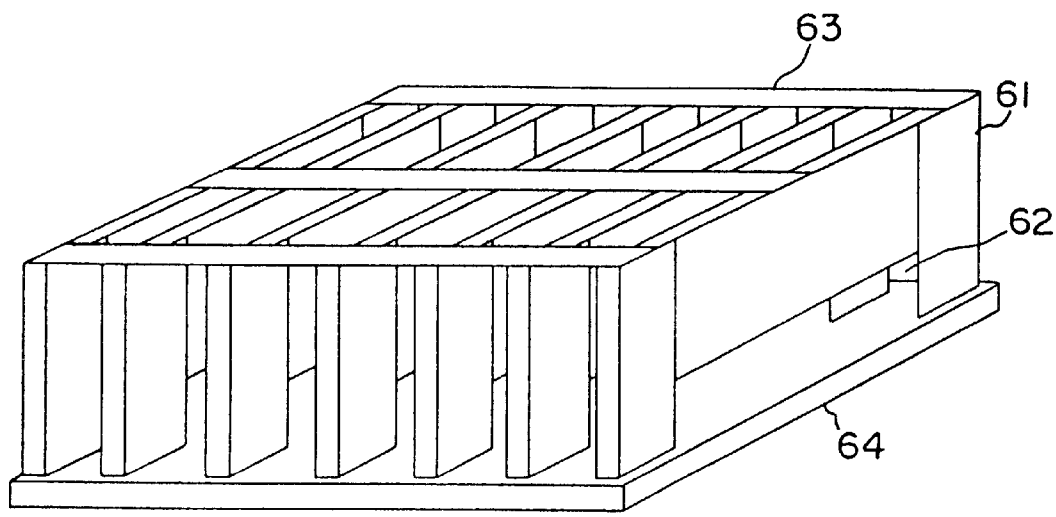
Figure 6B:
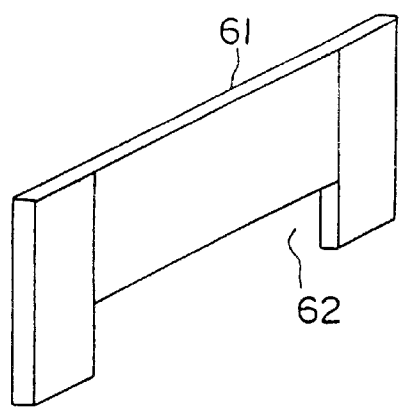

FIG. 6a shows a heat exchanger having a series of plate fins 61 each having a slot 62 near the base 64. Several bars 63 traverse the plate fins. A configurable plate fin 61 is shown in FIG. 6b as a discreet component. The slots 62, like the perforations 52 in FIG. 5a, allow for fluid communication between the channels and the low pressure region caused by the fluid bypass. This way, high pressure within the fin field vents to the sides. Likewise, the slots allow for omni-directional flow thereby allowing the fin field to be mounted in any direction relative to fluid flow.

FIG. 7a shows an alternative embodiment of the fin field described in FIG. 6a. In this fin field, the same plate fin structure is found in plate fin 71 with slot 72. However, the interior plate fins 75 are comprised of thin flat fins or, alternatively, pin fins 78. The various fins are connected by bar 73. FIG. 7b shows a discrete component of the heat exchanger wherein fin 71 has a slot 72 and connection means 77 on top. When the fin field is assembled, connection means 77 align to form the bar 73. FIG. 7c shows a side view of the fin 71. The configuration of this fin field in allows for a generous space 76 between the fin segments. Such a space facilitates easy fluid communication to provide the benefits as mentioned above.

Figure 8A:
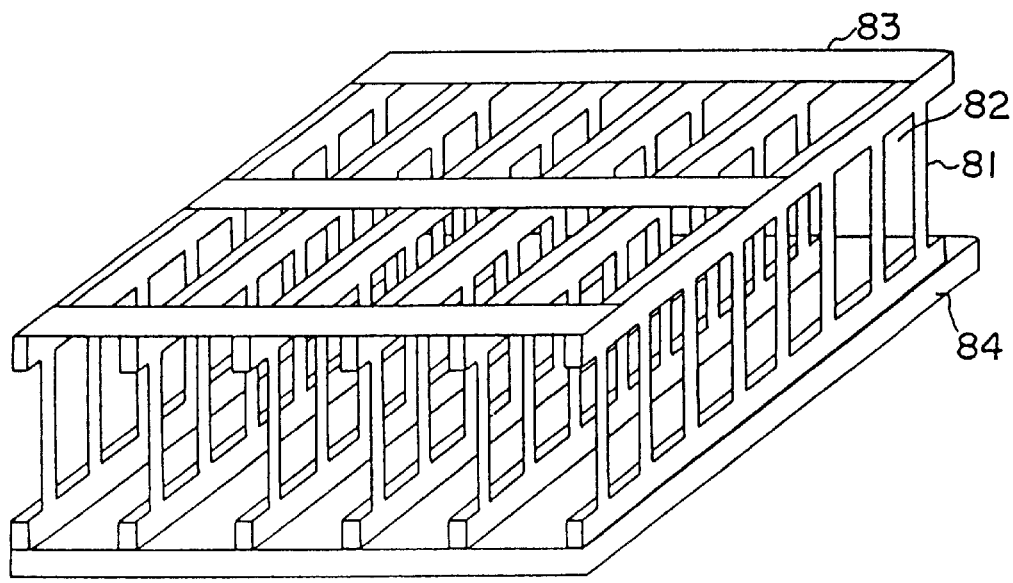
Figure 8B:
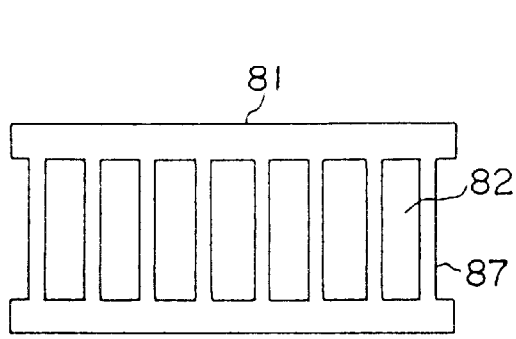
Figure 8D:
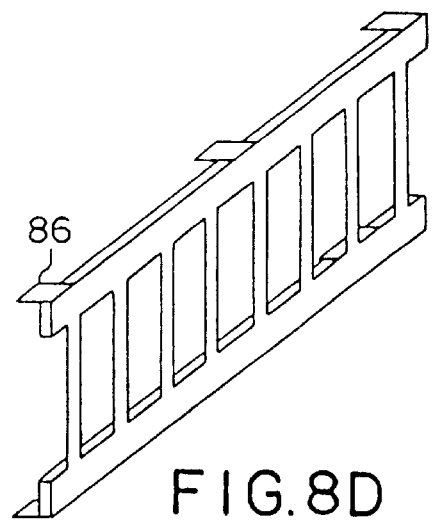
Figure 8C:
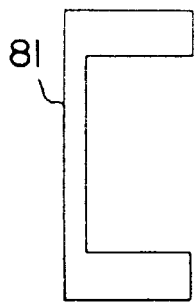

FIG. 8a shows a series of plate fins 81 having the same configuration as the interior fins of FIG. 7a. A configurable plate fin 81 is shown in FIG. 8b as a discreet component. Both the interior and exterior plate fins have substantially similar structure. FIG. 8d is a side elevational view of a discrete plate fin, illustrating the connection element 86 extending from the top surface of each plate fin 81. FIG. 8b is a front elevational view of a discrete plate fin, illustrating the vertical bar elements 87 evenly spaced along the length of the pate fin 81 and the spacing 82 between each of the bars. FIG. 8c shows a side view of a discrete plate fin, illustrating the vertical bar elements 81 and the connection elements 86. The spacing between each vertical bar element, together with the alignment of the plate fins 81 as illustrated in FIG. 8a provides for improved fluid communication across the side plate fins. As the plate fins 81 are assembled, the connection elements 86 form the transverse bars 83 as illustrated in FIG. 8a. Accordingly, the fin field of FIG. 8a is better suited for omni directional flow applications.

Figure 9A:
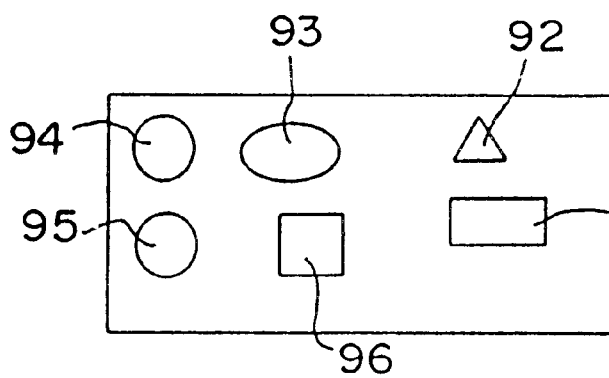
Figure 9B:
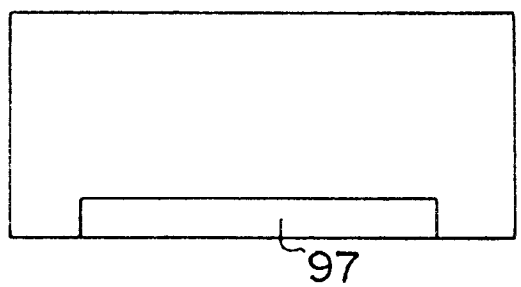
Figure 9C:
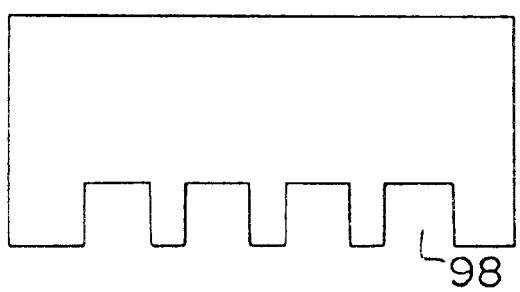
Figure 9D:
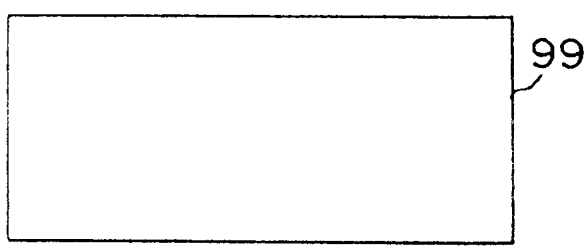
Figure 9E:
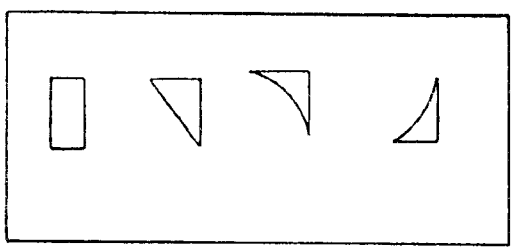

FIGS. 9a through 9d show a variety of different means for providing fluid communication between the plate fins. FIG. 9a shows a rectangular orifice 91, a triangular orifice 92, an oval orifice 93, a square orifice 96, a round orifice 94, and a circular orifice 95. FIG. 9b shows a plate fin having a slot 97 located at its bottom, while FIG. 9c shows a series of slots 98 located at the bottom. A variety of different fin slits 99 are shown in FIG. 9d. FIG. 9e illustrates a fin perforated with flow guides. The flow guides illustrated are straight, angled and curved in both upward and downward directions. Accordingly, each individual fin can have surface cutouts for accommodating the fluid flow through the fins.

Figure 10A:
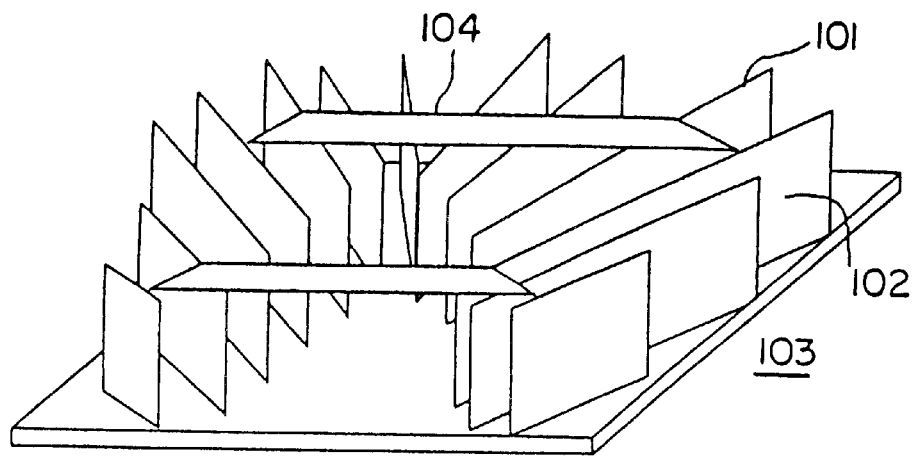
Figure 10B:
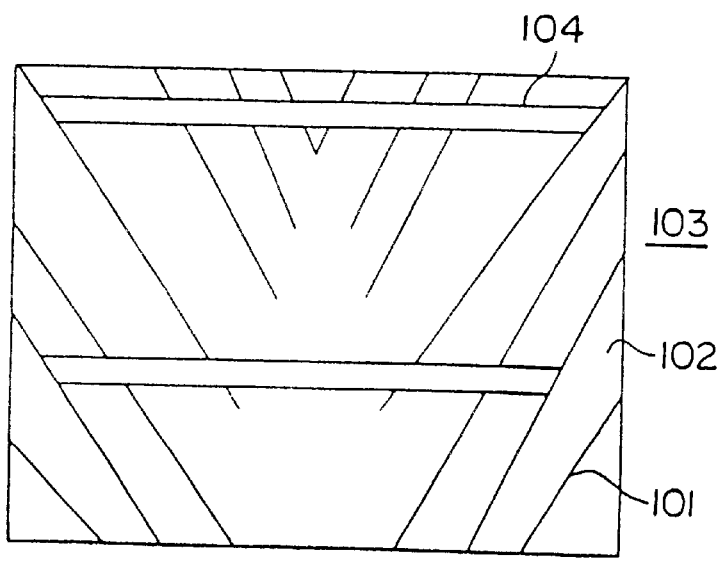

FIGS. 10a and 10b show a perspective and top view respectively of a heat exchanger having plate fins 101 radially disposed on a base such that a portion of channels 102 is exposed to the side of the heat exchanger. This configuration allows the low pressure caused by flow bypass to draw fluid through the channels 102. The configuration is further improved by having bars 104 located on the tops of plate fins. The bars not only guide flow but also add structural integrity to the heat exchanger.

FIG. 11a shows a heat exchanger having plate fins 111 with flow guide means 112 mounted thereon. A discrete plate fin component of the heat exchanger is shown in FIG. 11b. The flow guide means 112 in this particular embodiment are curved downward relative to the direction of fluid flow. Thus, if the fluid flow direction is from the bottom left-hand side of the drawing to the top right-hand side, the configuration of the flow guide means forces the fluid in a downward direction.

Figure 12A:
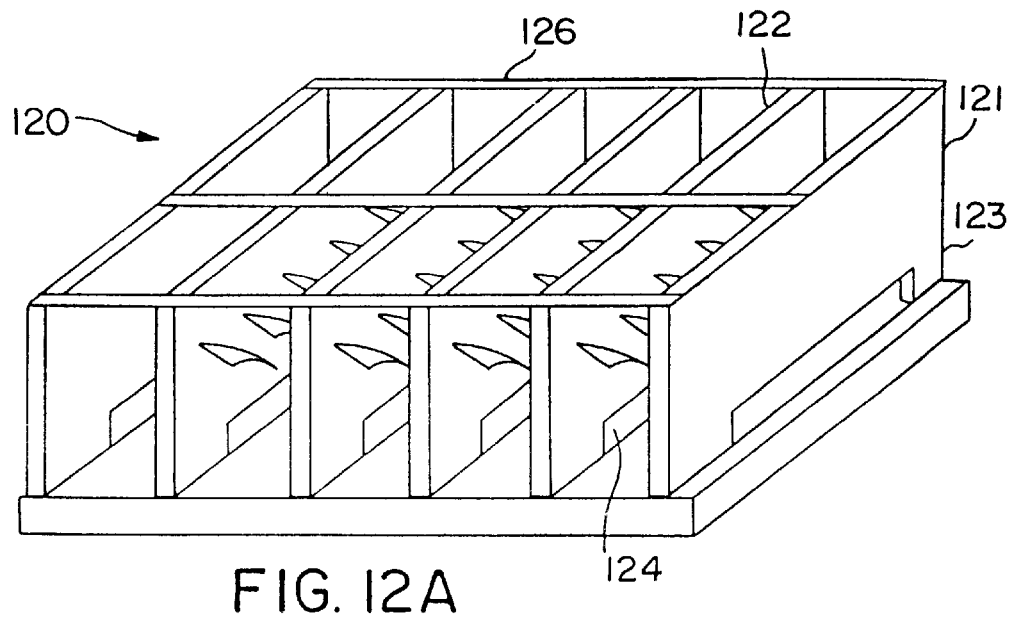
Figure 12B:
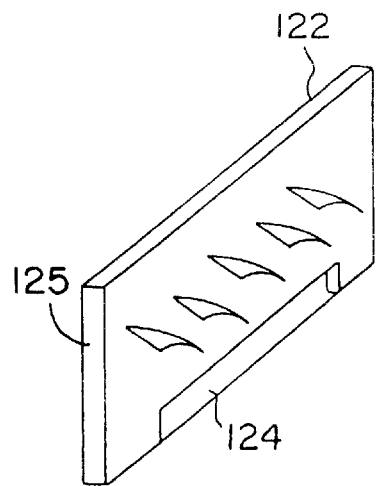
Figure 12C:
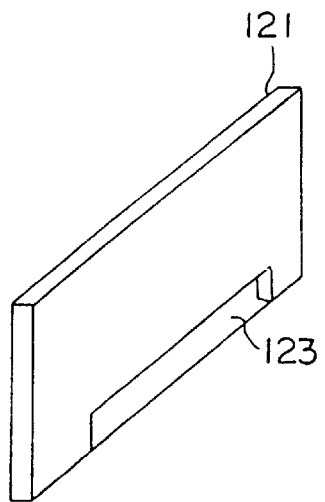

FIG. 12a shows a variation of the exchanger in FIG. 11. In this exchanger, slots 124 are added to plate fins 121 of the interior plate fins while a slot 23 is added to plate fin 121 of the exterior plate fins. FIGS. 12b and 12c show the discrete plate fin components of the interior and exterior configuration, respectively. More particularly, FIG. 12 illustrates an interior fin 122 with flow guide means 125 similar to that disclosed in FIG. 11b. The flow guide means 125 illustrated in FIGS. 12a and 12b are vanes curved in a downward direction relative to the direction of fluid flow. Each of the exterior plate fins 121 comprises a slot 123 similar to the exterior fin 71, as illustrated in FIGS. 7a and 7c. In addition, as the interior and exterior fins are assembled to form the heat exchanger as illustrated in FIG. 12a, the heat exchanger comprises several bars 126 which transverse the plate fins. The transverse bars 126, similar to those disclosed in several embodiments disclosed herein, add structural integrity to the heat exchanger 120, as well as act as a flow control means for imparting a downward force on the fluid attempting to exit the heat exchanger through the top surface.

FIG. 13 shows a variety of different flow guide means. A preferred louvered flow guide is shown in FIG. 13a. This flow guide is created by cutting a slot in a plate fin 131 to partially circumscribe a peninsula portion. The peninsula portion remains connected to the plate fin 131 by a tab portion 133. The peninsula portion is then bent along the tab such that it protrudes at an angle from the plate fin 131. This method not only forms an integral flow guide 132, but also leaves an orifice to facilitate fluid communication. Accordingly, the method results in a flow guide that is integral to the plate fin and that is disposed along the periphery of an aperture. The apertures in each of the plate fins 131 are formed from the displacement of the flow guides from the surface of the plate fin 131. Each of the apertures has a volume substantially similar to the flow guide. Accordingly, this configuration not only forms an integral flow guide 132, but also leaves an aperture 139 to facilitate fluid communication.

Figure 13A:
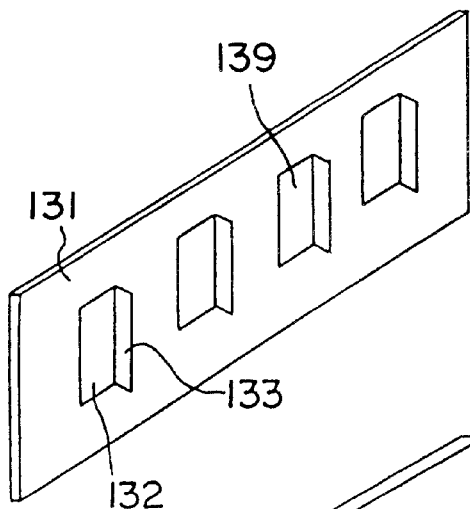
Figure 13B:
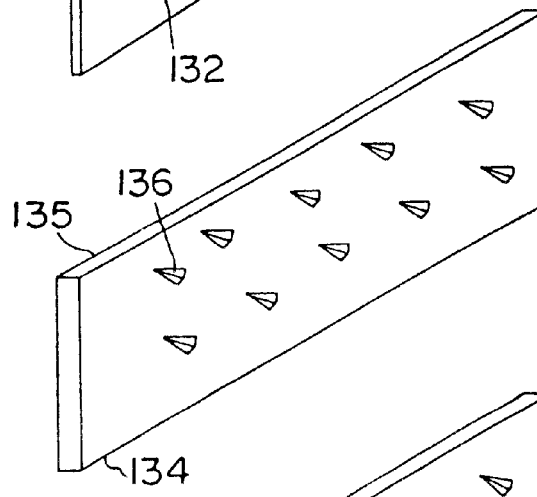
Figure 13C:
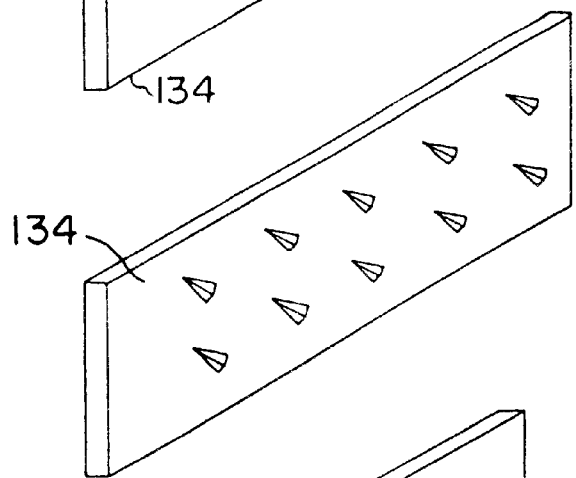
Figure 13D:
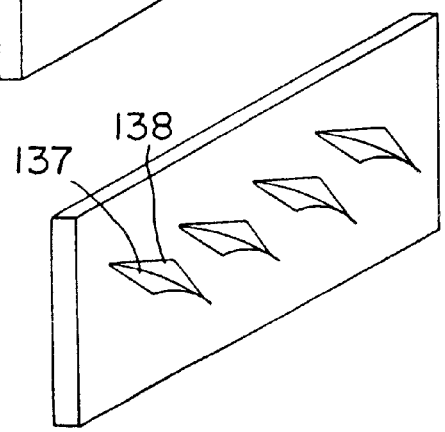

FIGS. 13b and 13c illustrates flow guides made in a similar fashion wherein sections were bent from plate fin 134 to leave triangular orifices 136 above and below the flow guides respectively. FIG. 13d shows flow guides that are also bent from a plate fin, but in this case, form a curved flow guide 37 leaving a orifice 138 in the plate fin.

FIGS. 14a through 14c show a typical narrow channel heat exchanger 142 having a flow guide 141 mounted to the top thereon. As shown in FIG. 14b, it is preferred that this particular flow guide extend at an acute angle relative to the front plane of the fin field.

FIGS. 15a through 15c again show a narrow channel heat exchanger 151 having, in this case, a modified flow guide 152. It has a similar configuration to that shown in FIG. 14, however, on the exit end of the heat exchanger 151, there is an additional flow guide 152. In this case, the flow guide 152 extends at an obtuse angle 153 relative to the rear plane portion of the heat exchanger 151.

Figure 16A:
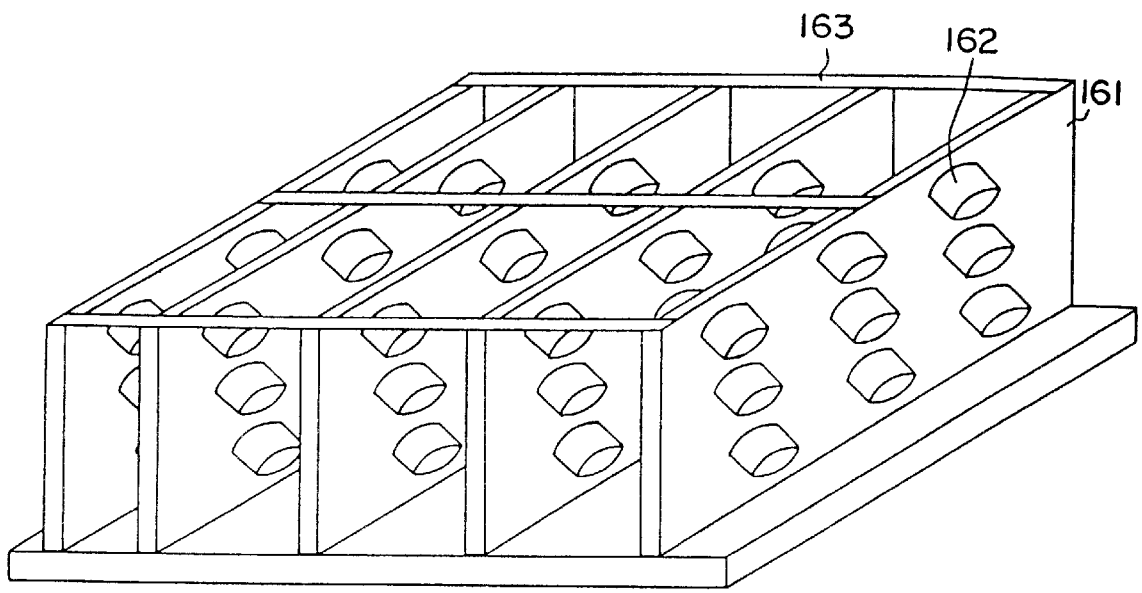
Figure 16B:
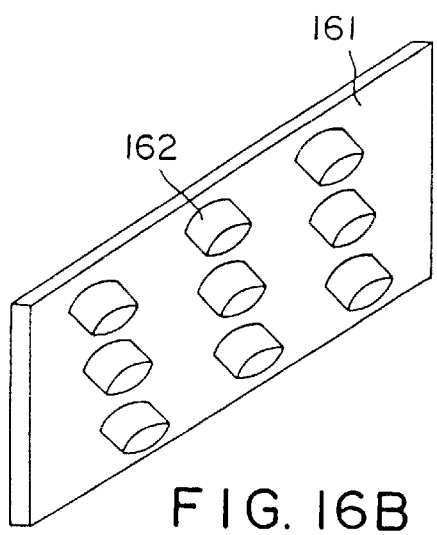

FIG. 16a shows a heat exchanger with a series of plate fins 161 each having a plurality of textured portion 162. The plate fins are joined together by support means 163. FIG. 16b shows a discrete plate fin component of this configuration. By texturing the plate fin, fluid passing along the fin is disturbed which thereby disrupts the boundary layer. As mentioned above, the boundary layer blankets and otherwise insulates the plate fin from the cooling fluid.

Figure 17A:
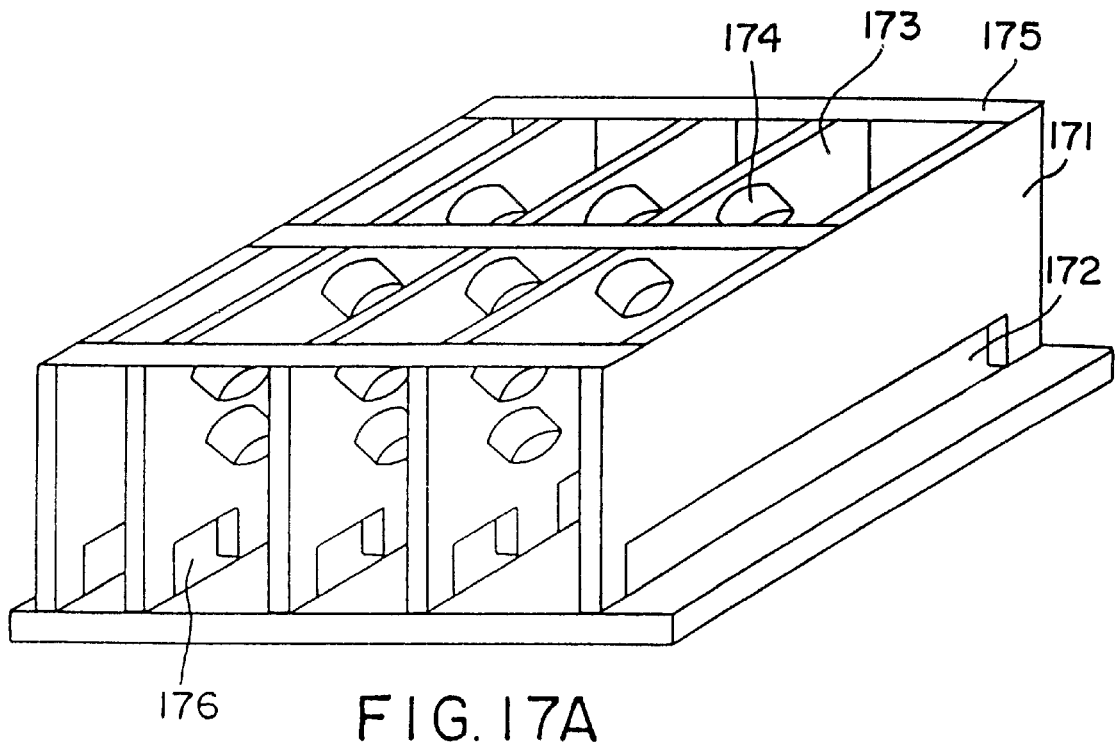
Figure 17B:
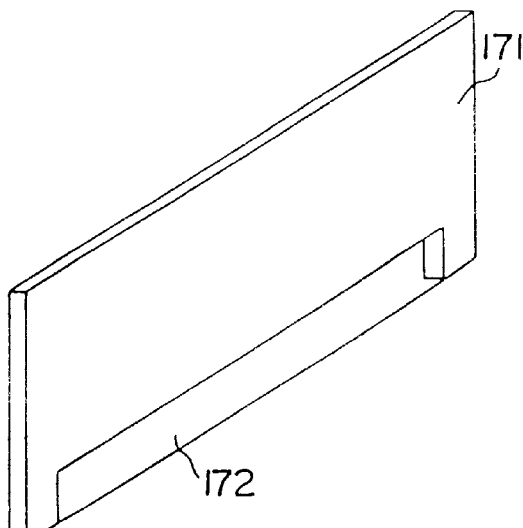
Figure 17C:
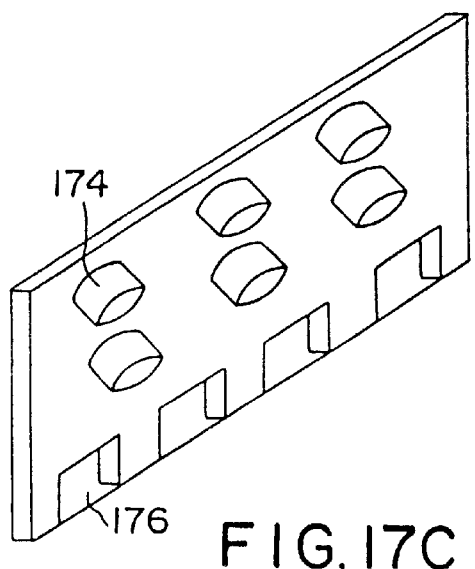

FIG. 17a shows a heat exchanger similar to that illustrated in FIG. 16, however, the plate fins have means of communication, in this case louvers 176 and slots 172. The various plate fins are joined together by support means 175. FIG. 17b shows a discrete exterior plate fin 171 having a slot 172, and FIG. 17c shows a discrete interior plate fin having louvered sections 176 and textured regions 174. The exterior plate fins 171 differ from the interior plate fins 173 in that they have no textured surface, nor do they have louvered sections 176 protruding therefrom. This is done for both aesthetics and structural reasons; the textured portions may be considered unsightly and louvers on the side plate fins may pose a risk of snagging. The benefit of this configuration is having a plate fin surface that not only disrupts the boundary layer, but also facilitates fluid communication as described above.

Figure 18A:
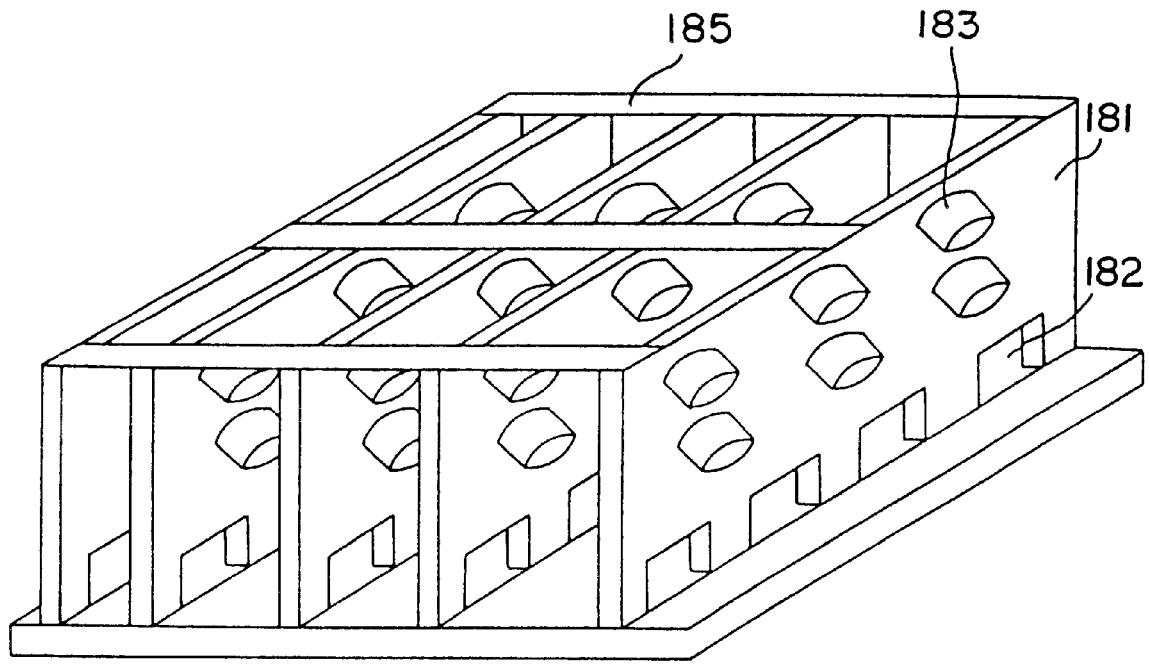
Figure 18B:
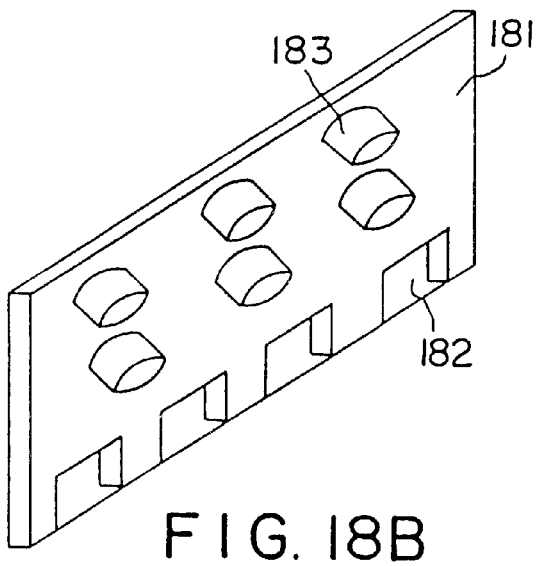

FIG. 18a is similar to that of 17a, however, the exterior plate fin 181 is similar to the interior plate fins. That is, both the interior plate fins and the exterior plate fins have textured regions 183 and louvered sections 182. In addition, the heat exchange has several bars 185 which transverse the plate fins. Accordingly, the alignment of the textured regions 183 and louvered regions 182 provides for fluid flow without impediments between the interior and exterior fins.

Figure 19A:
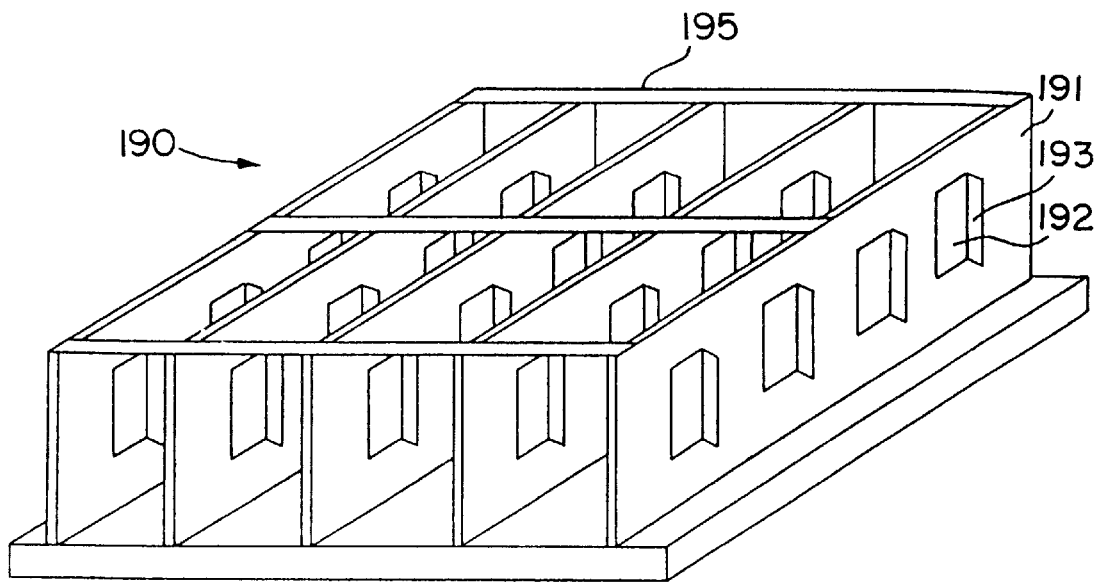
Figure 19B:
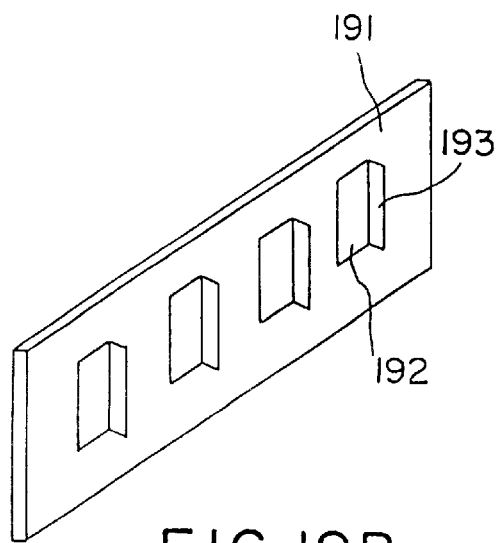

FIGS. 19a and 19b illustrate a heat exchanger incorporating a plate fin 191 similar to that illustrated in FIG. 13a. The plate fin 191 comprises perforations having rectangular shaped openings 192 with 90 degree louvered sections 193. FIG. 19a is a perspective view of a heat exchanger 190 comprised of individual plate fins 191, where both the interior and exterior fins comprise the structure as illustrated in FIG. 19b. The fins 191 of the heat exchanger are joined together by support means 195. Accordingly, the alignment of the plate fins 191 with the openings 192 causes the fluid passing along the fin to be disturbed, thereby disrupting the boundary layer and providing access to the cooling fluid.

Figure 20A:
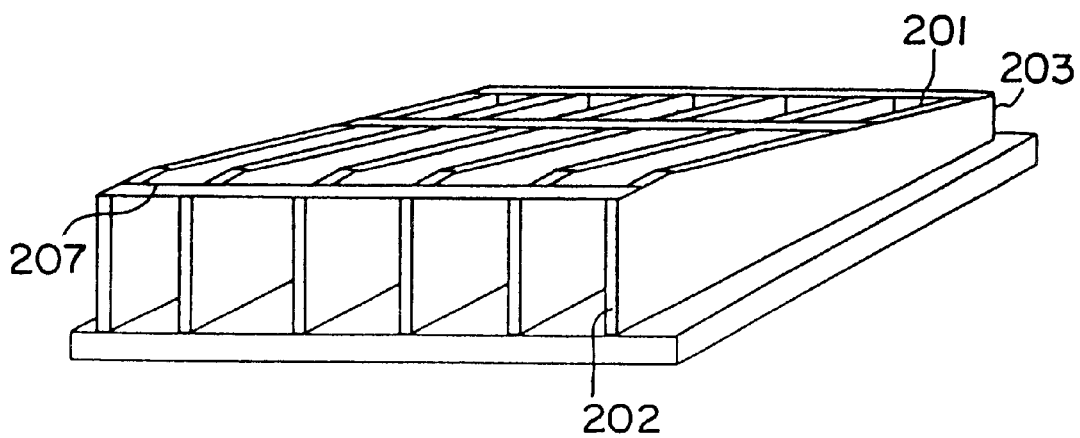
Figure 20B:
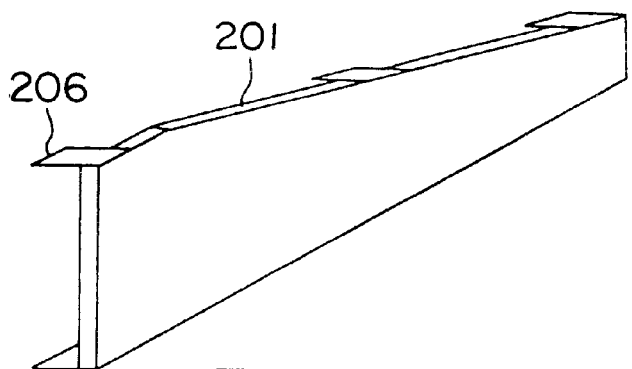

FIG. 20a shows a heat exchanger having plate fins of varying cross-sectional area relative to the fluid flow, and FIG. 20b shows a discrete plate fin having the taper and connection means 204. In regard to the taper, plate fin 201 decreases in cross-sectional area from the intake region 202 to the exhaust region 203. Each plate fin 201 comprises connection elements 206 extending from the top surface of each plate fin 201. As the plate fins 201 are assembled, the connection elements 206 form transverse bars 207 as illustrated in FIG. 20a. Accordingly, the taper reduces the friction on the fluid moving through the fin field thereby decreasing stagnation problems.

Figure 21A:
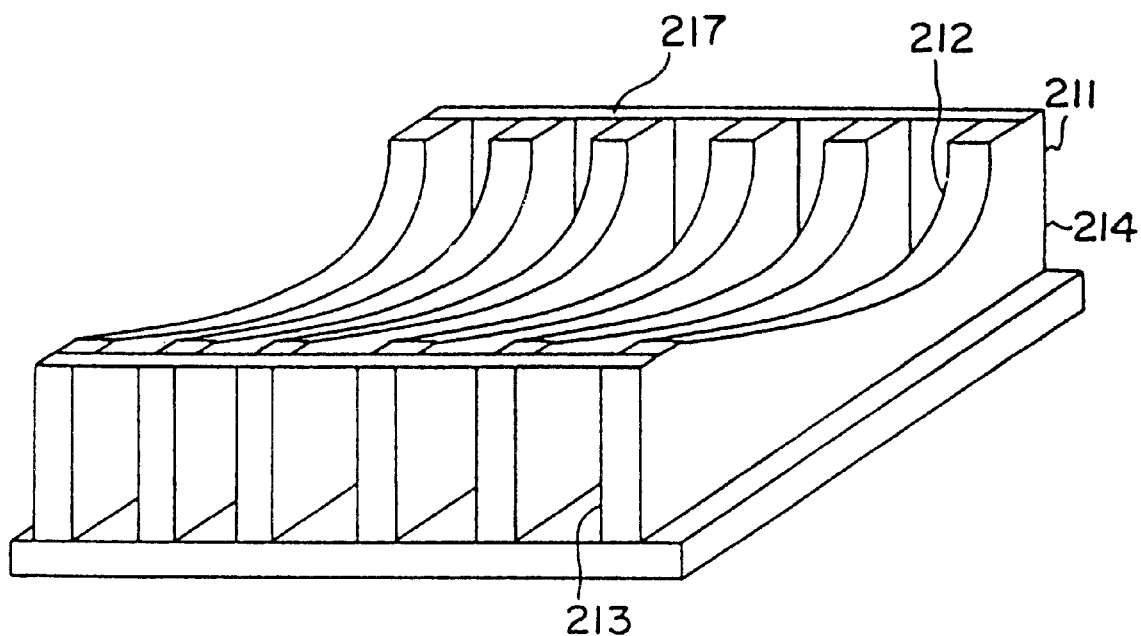
Figure 21B:
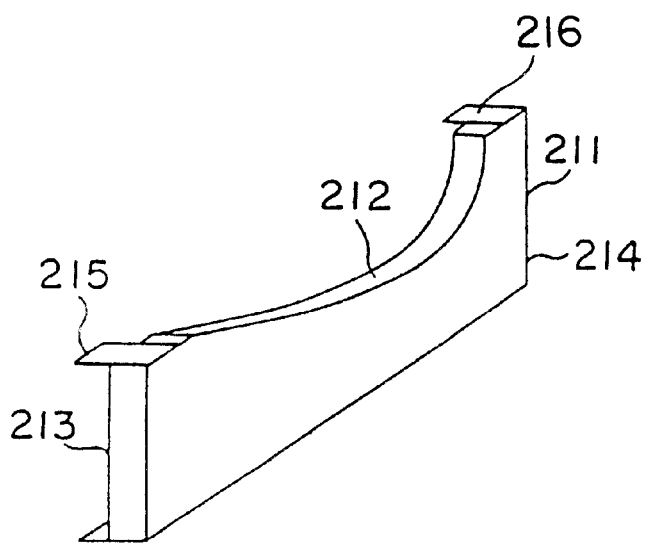

FIG. 21a shows a variation of the plate fin shape wherein a curved notch is removed from the plate fin 211. FIG. 21b depicts a discrete plate fin 211 having a curved profile 212. The curved profile correlates to frictions exponential relationship to velocity. The function behind this particular design is to reduce the drag on fluid entering from the intake region 213, while increasing the friction on fluid entering from the exhaust region 214. Each fin comprises connection elements 216 extending from the top surface of each plate fin 211. As the plate fins 211 are assembled, the connection elements 216 align to form transverse bars 217, as illustrated in FIG. 21a. The transverse bars 217 add structural integrity to the assembled heat exchanger, as well as act as a flow control means. More specifically, the transverse bars 217 act as a flow guide means for imparting a downward force on the fluid attempting to exit through the top surface area of the heat exchanger. Accordingly, this configuration reduces the flow of fluid in through the exhaust region.

Figure 22A:
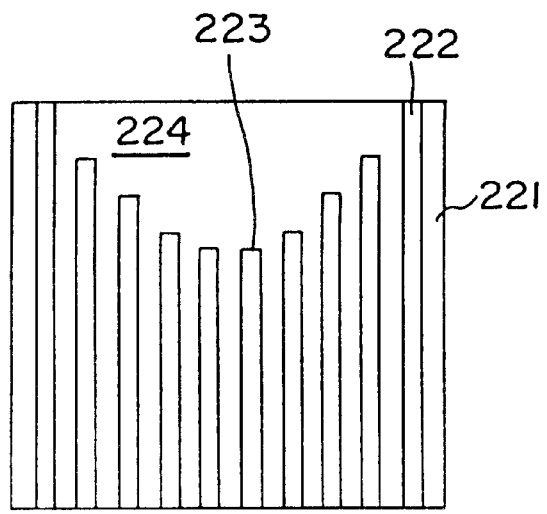
Figure 22B:
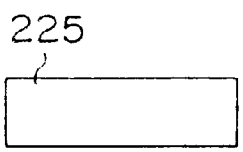
Figure 22C:
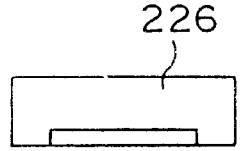
Figure 22D:
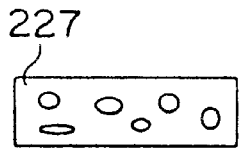

FIG. 22a shows a heat exchanger having plate fins of varying length. The fins range from a long length 222 to a short length of 223 to from a clear region 224. This region has very little frictional effect on the fluid therefore reducing the formation of stagnant regions within the fin field. It should be clear to those skilled in the art that a variety of configurations are possible to create a clear region 224. It should also be obvious that the plate fins used in this configuration can incorporate any combination of the flow control means discussed herein. Suitable configuration include a flat plate fin 225 as shown in FIG. 22b, a slotted plate fin 226 as shown in FIG. 22c, and a perforated plate fin 227 as shown in FIG. 22d.

Figure 23A:
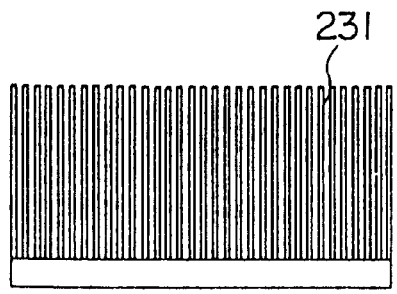
Figure 23B:
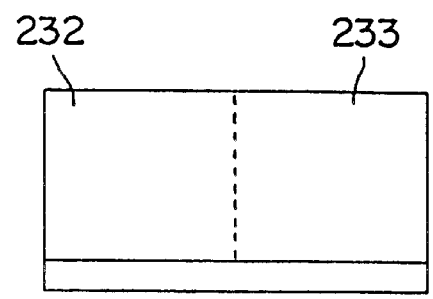
Figure 23C:
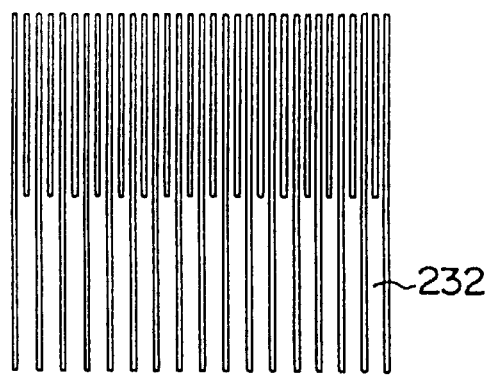

FIGS. 23a through 23c show a narrow channel heat exchanger 231 having a plate fin 233 with a section removed from it. As FIG. 23c shows, the removal results in a vacant area 232 which reduces the drag or friction on fluid moving through the channels. This results in reduced fluid stagnation and the problems associated therewith.

Figure 24A:
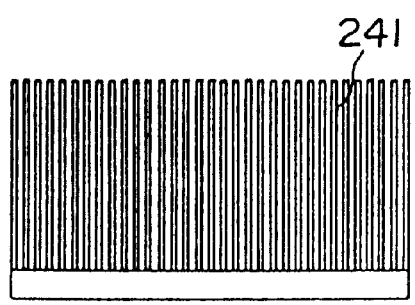
Figure 24B:
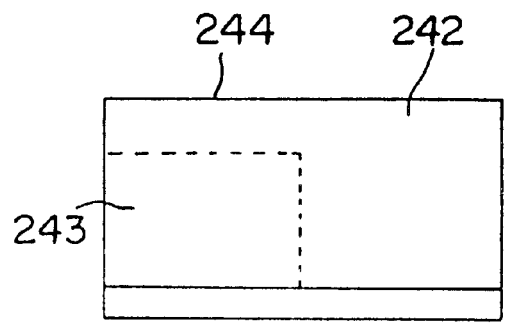
Figure 24C:
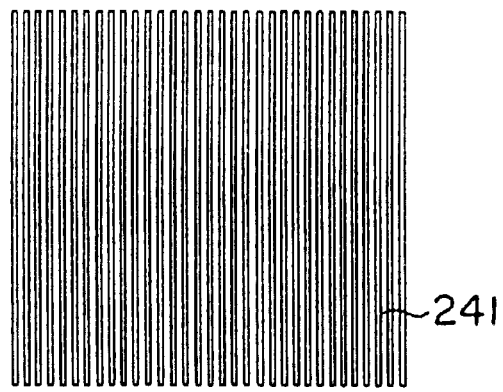

FIGS. 24a through 24c are similar to that of FIG. 23, however, rather than having an entire section removed from the plate fin, a smaller section 243 is removed from the fin 242, leaving a top portion 244 in tact. This configuration also provides for reduced drag, but also provides greater surface area for heat exchange. Furthermore, this area is located towards the top of the heat exchanger where stagnant fluid is generally not a problem.

Figure 25A:
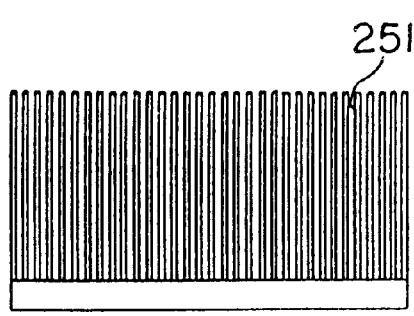
Figure 25B:
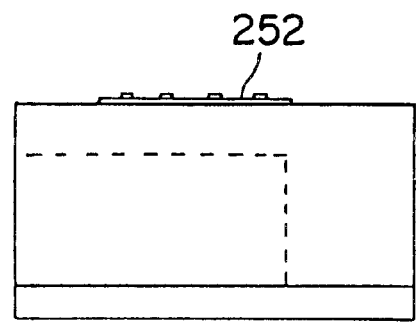
Figure 25C:
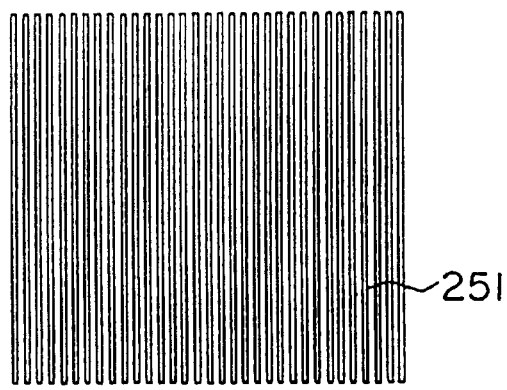

FIGS. 25a through 25c show a narrow channel heat exchanger 251 similar to FIG. 24, however, this design also has a top plate 252 having a certain profile. The top plate 252 disturbs the fluid bypassing the fin field 251 therefore slowing it down and creating a higher pressure above the fin field. This higher pressure tends to restrict egress of fluid from the fin field 251, and may even facilitate fluid ingress.

FIG. 26a shows a heat exchanger having a plate fin made of segments 261. Segments are spaced so that a gap 263 is formed between them. In this particular embodiment, a top bar 262 is used to join the two sections together as well as connect the various plate fin components together. FIG. 26b shows a discrete plate fin component having sections 261 and gaps 263, and FIG. 26c shows a complementing plate fin arrangement having connection means 264 extending from a top surface of the plate fin. As mentioned above, when assembled in series, connection means 264 form transverse bars 262 that adds both integrity and improved heat conduction to the heat exchanger. The benefit of this design is that it allows for easy communication between the channels. Moreover, the plurality of top bars restricts the egress of fluid from the channels.

Figure 27A:
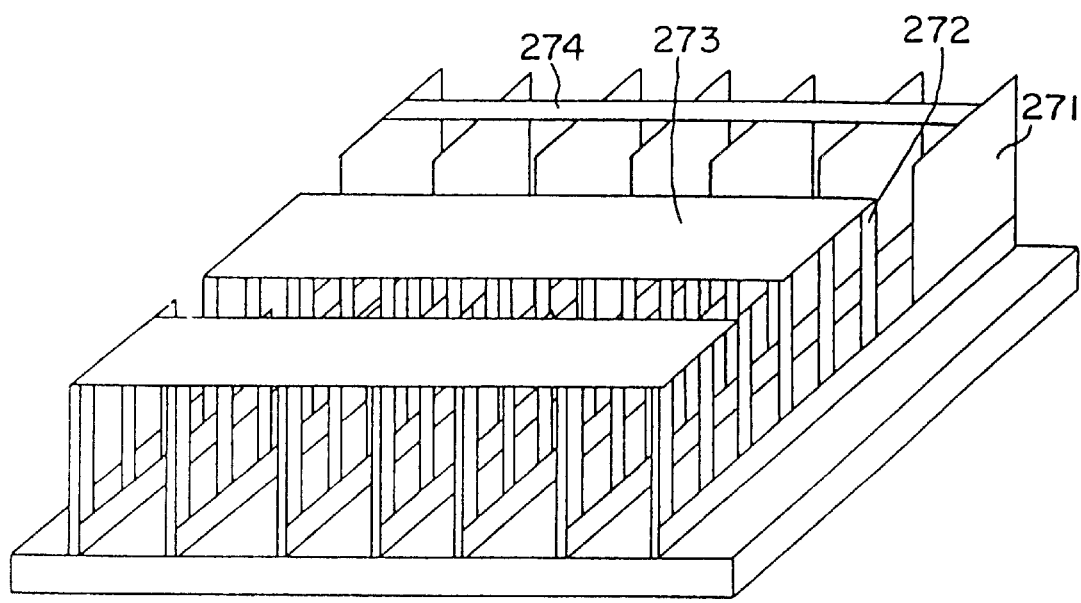
Figure 27B:
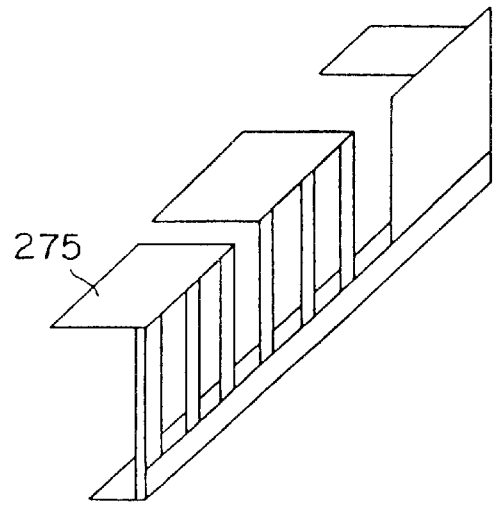

FIG. 27a shows a perspective view of a heat exchanger having plate fins comprised of different components. FIG. 27b illustrates one such discrete plate fin having connection means 275 extending from the top surface of the fin. In this embodiment, the plate fin has a high surface area component 271 along with low surface area components 272. Securing the various low surface area components together are transverse bars 273, and connecting the various high surface area components together is another transverse bar 274. As shown in FIG. 27a, transverse bars 273 and 274 extend lengthwise across the heat exchanger, however bar 273 is significantly wider than bar 274. Accordingly, the benefit of this design is that it allows for easy fluid communication in the front region of the heat exchanger where fluid stagnation has its greatest impact, while providing high friction towards the rear of the heat exchanger where the ingress of fluid from the bypass contributes to stagnation.

Figure 28A:
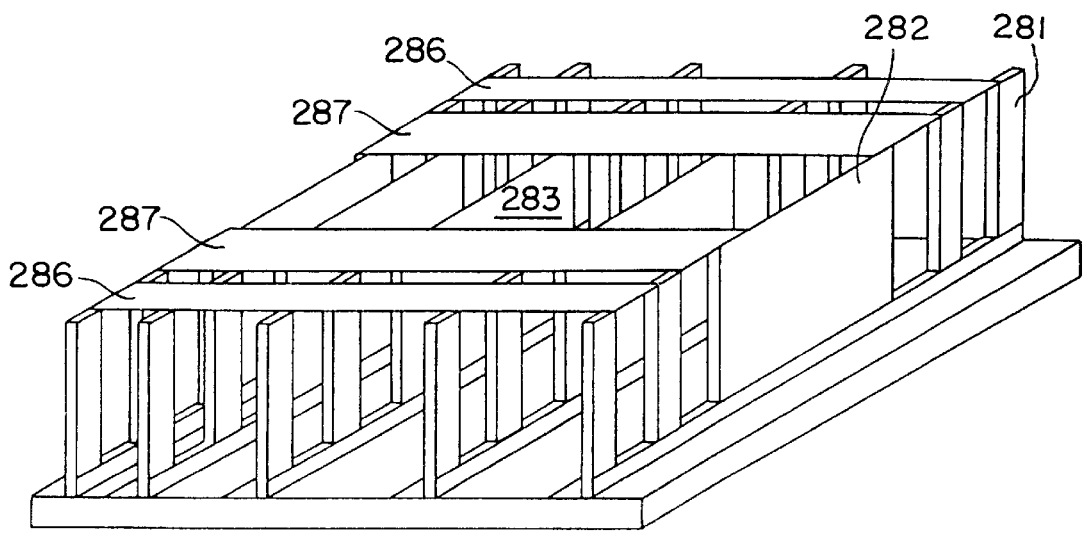
Figure 28B:
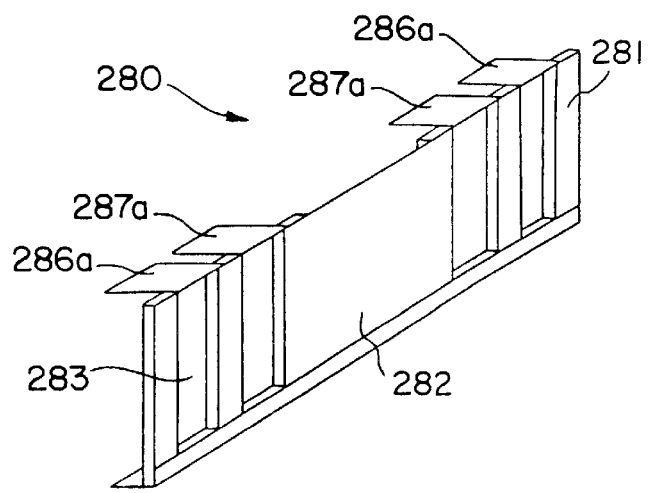

FIG. 28a shows a similar configuration as that illustrated in FIG. 27a, except rather than having the high surface area components 282 in the rear of the exchanger, they are placed in the middle section of the heat exchanger. Again, low surface area components are used in and around these larger sections. The low surface area components 281 are spaced so that a gap 283 is formed between them. In this particular embodiment, transverse bars 286 and 287 are formed from connection elements 286a and 287a extending from a top surface of each plate fin 280. FIG. 28b illustrates a discrete plate fin component 280 having sections 281 and 282 and gaps 283. When the individual plate fins 280 are assembled in series connection, elements 286a and 287a form transverse bars 286 and 287 that adds both structural integrity and improved heat conduction to the heat exchanger. This design is particularly well-suited for a fan which would be placed in and around section 285. In this way, fluid is drawn in through low frictional areas on either side of the heat exchanger and the forced convection of the fan pulls it through the high surface area fin components 282.

Figure 29A:
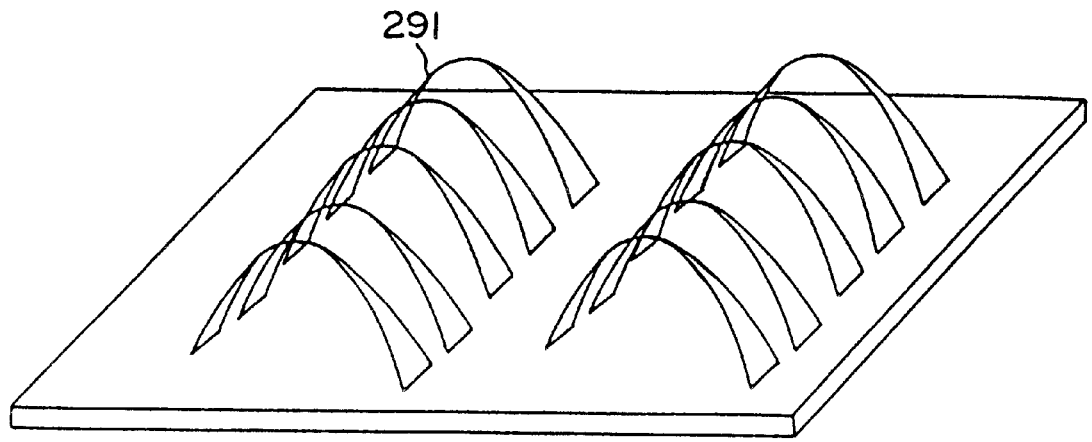
Figure 29B:
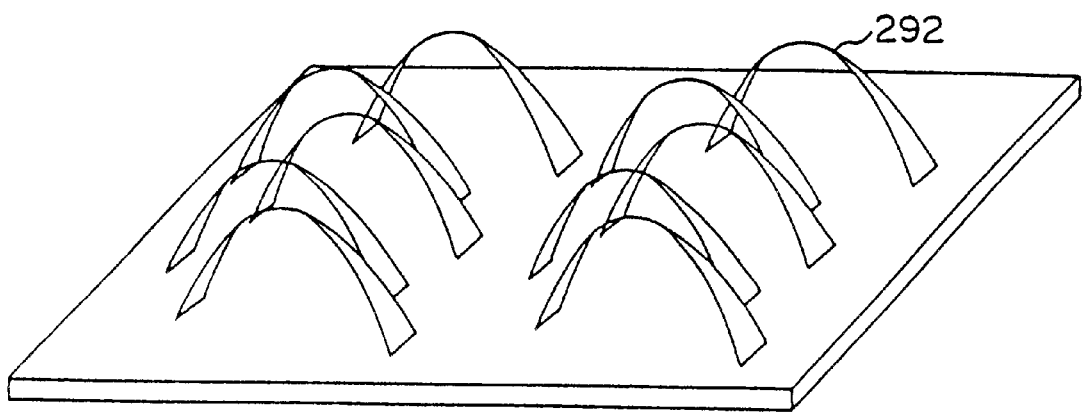

FIGS. 29a and 29b show an alternative type of fin field wherein the fin is arched. In FIG. 29a the fins 291 are aligned, while in FIG. 29b the fins 292 are staggered. The advantage of the in-line configuration is the ease of fluid flow and low frictional losses. The advantage of the staggered design is a more efficient heat conduction since the fins 292 are exposed to "fresh" fluid flow, not previously exposed to a fin.

Figure 29C:
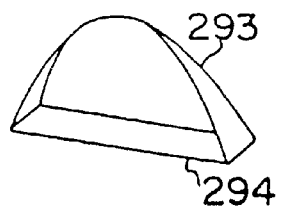
Figure 29D:
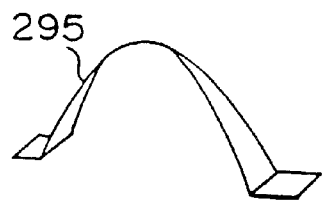

FIGS. 29c and 29d show alternate embodiments of the curved fin design. FIG. 29c shows a fin 293 having a base 294 integral to it, while the fin in FIG. 29d is open at the bottom having tabs for connection to a base element of a heat exchanger.

Figure 30A:
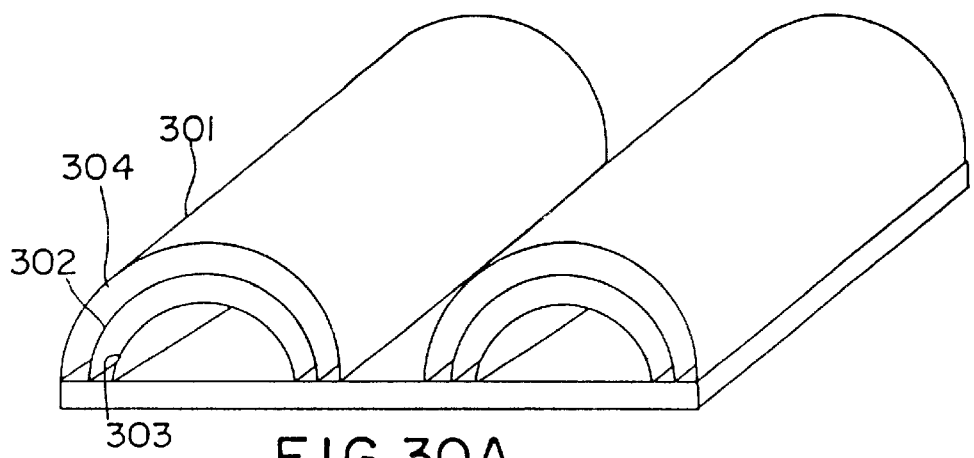
Figure 30B:
Figure 30C:
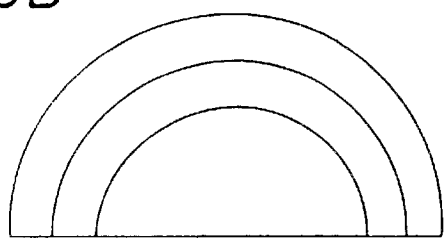
Figure 30D:
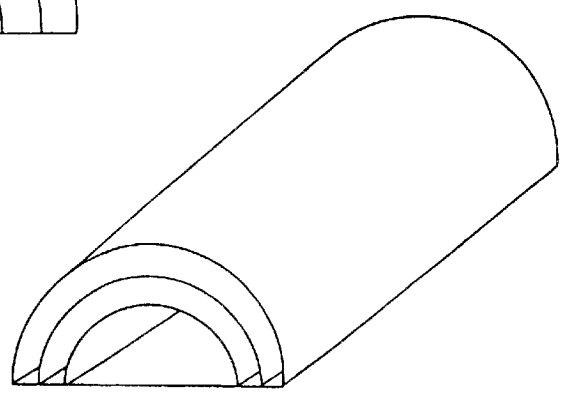

FIG. 30a shows yet another embodiment of an improved heat exchanger 305 employing the flow control means of the present invention. Here, the fin field consists of concentric arcuate sections of fin. That is, there is an interior section 303, a middle section 302, and an exterior section 301. These sections are formed to define arcuate channels 304 between them. The enclosed nature of this design prevents the egress of fluid prematurely. FIGS. 30b, 30c and 30d illustrate the progression of assembly of the semi-circular shaped fins. One of the benefits associated with this fin configuration is the increased surface area being provided. Additionally, the fins may be modified as suggested above with both slots and orifices or textures. In this way, the low pressure regions created by flow by-pass draw the stagnant air out. With such orifices or slots, the fin field actually becomes omni-directional. Thus, instead of having fluid drawn out of the fin field through the orifices, the main flow could be through the orifices or slots and the stagnant fluid could be drawn out through the channels 304.

Figure 31:
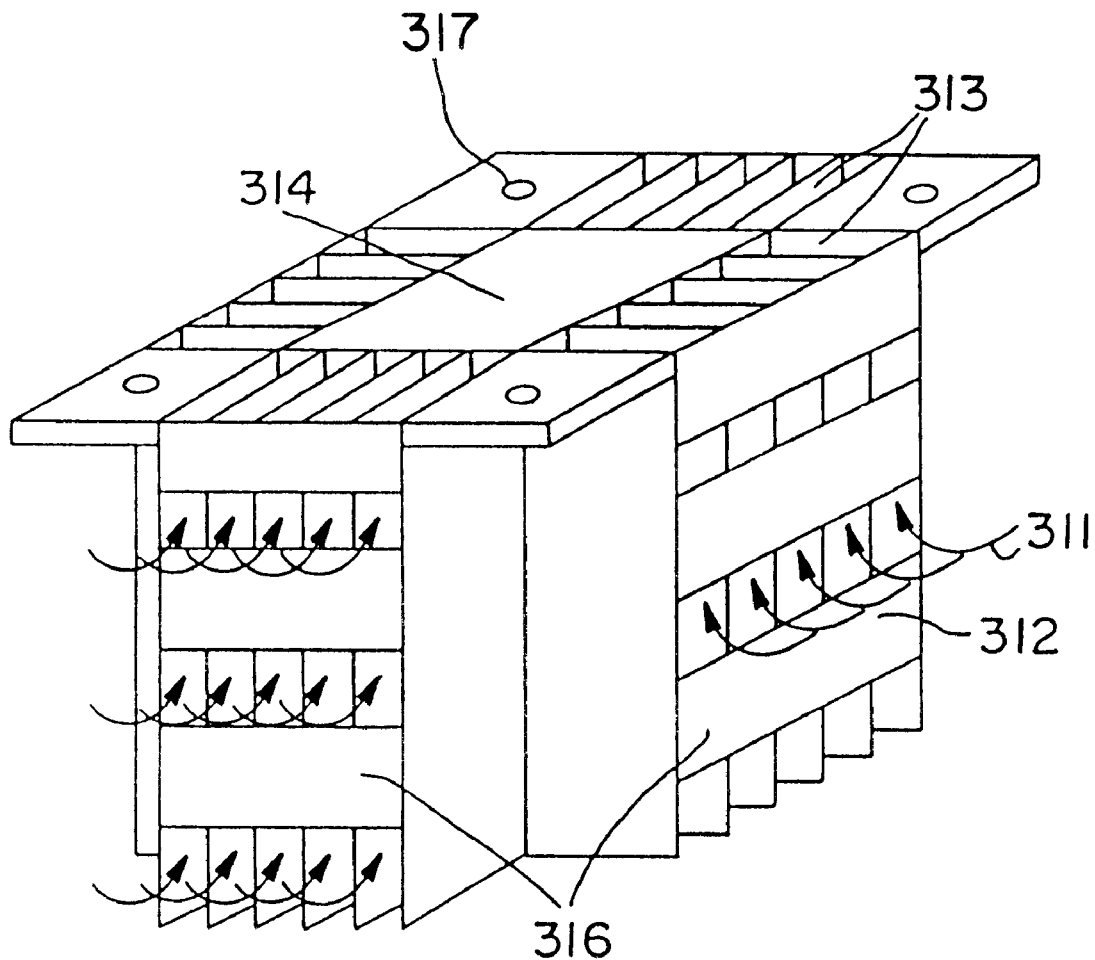

FIG. 31 illustrates a narrow channel heat exchanger comprising four different heat exchangers arranged in a square thereby defining a heat tower 314 in the center. Each fin field comprises fin plates 313 having a vertical orientation. The tops of these plate fins are joined by flow guides 316. In this particular embodiment, a fan mounting platform 317 is provided at the top of the fin fields to receive a fan. The fan draws fluid 311 through said fin plates 313. The flow guides 316 restrict the intake of such fluid giving it a near perpendicular ingress orientation which results in a near impingement situation.

Figure 32:
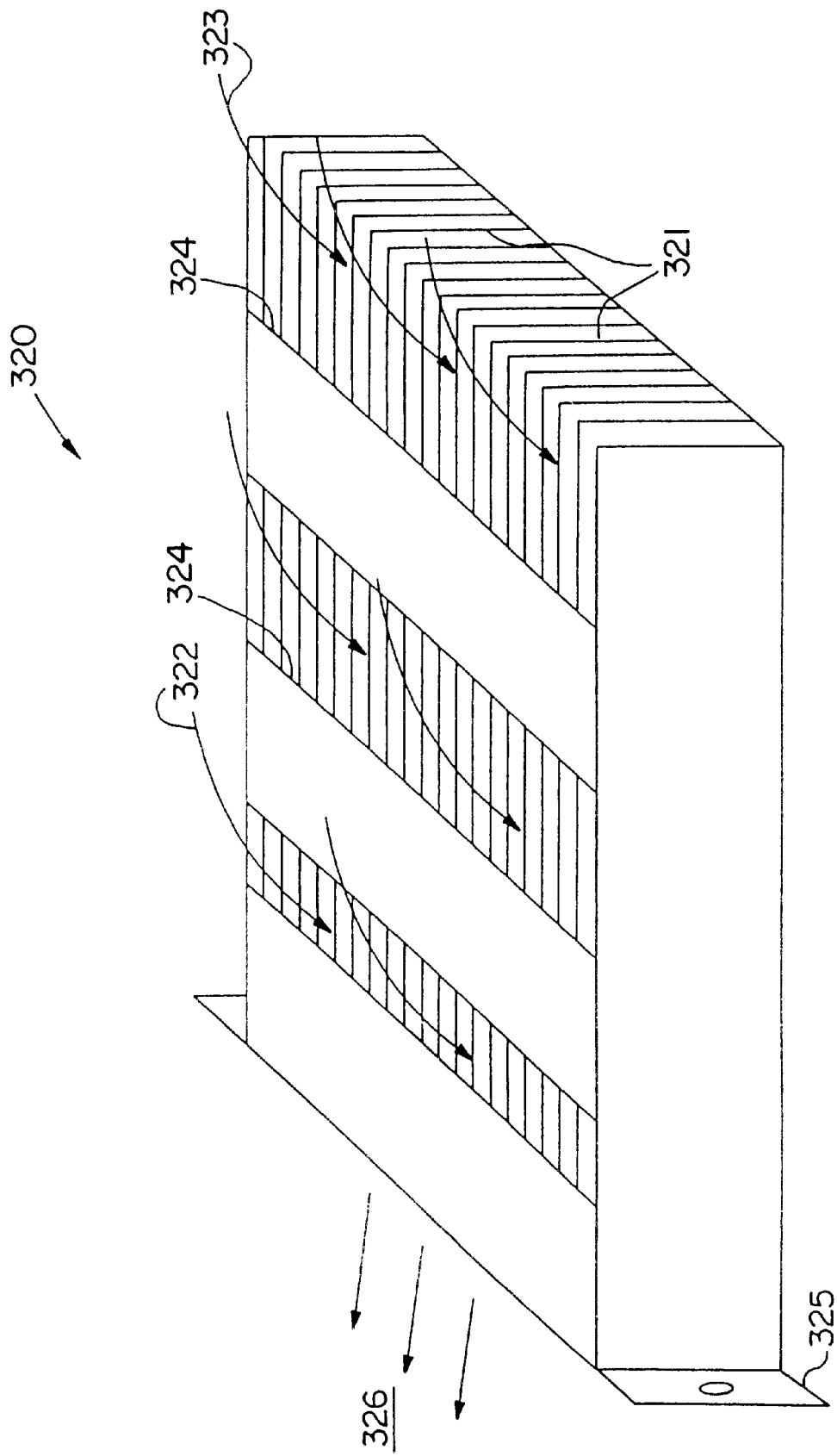

FIG. 32 shows another heat exchanger 320 configuration adapted to receive a fan. The heat exchanger 320 is a low profile narrow channel heat exchanger using a blower to move the fluid. In this embodiment, plate fins 321 are arranged on a base, and flow guides 324 in the form of transverse bars extend the width of the heat exchanger 320 across the top of the plate fins. The heat sink 320 comprises mounting plates 325 extending at a 90° angle from the body of the heat exchanger 320 at a front end. The mounting plates 325 are intended to secure the heat exchange 320 adjacent to a fan or blower (not shown). This configuration allows the restricted intake of fluid through the top end of said fin field. As fluid is drawn into the fin field, either through the top end, as illustrated at 322, or the back end 323, the fluid is drawn out through the fan at the front end, as illustrated at 326. The restricted access provided by the flow guides in this configuration thereby creates a near impingement condition. Accordingly, this heat exchanger 320 is intended for electronics applications with height constraints.

Figure 33:
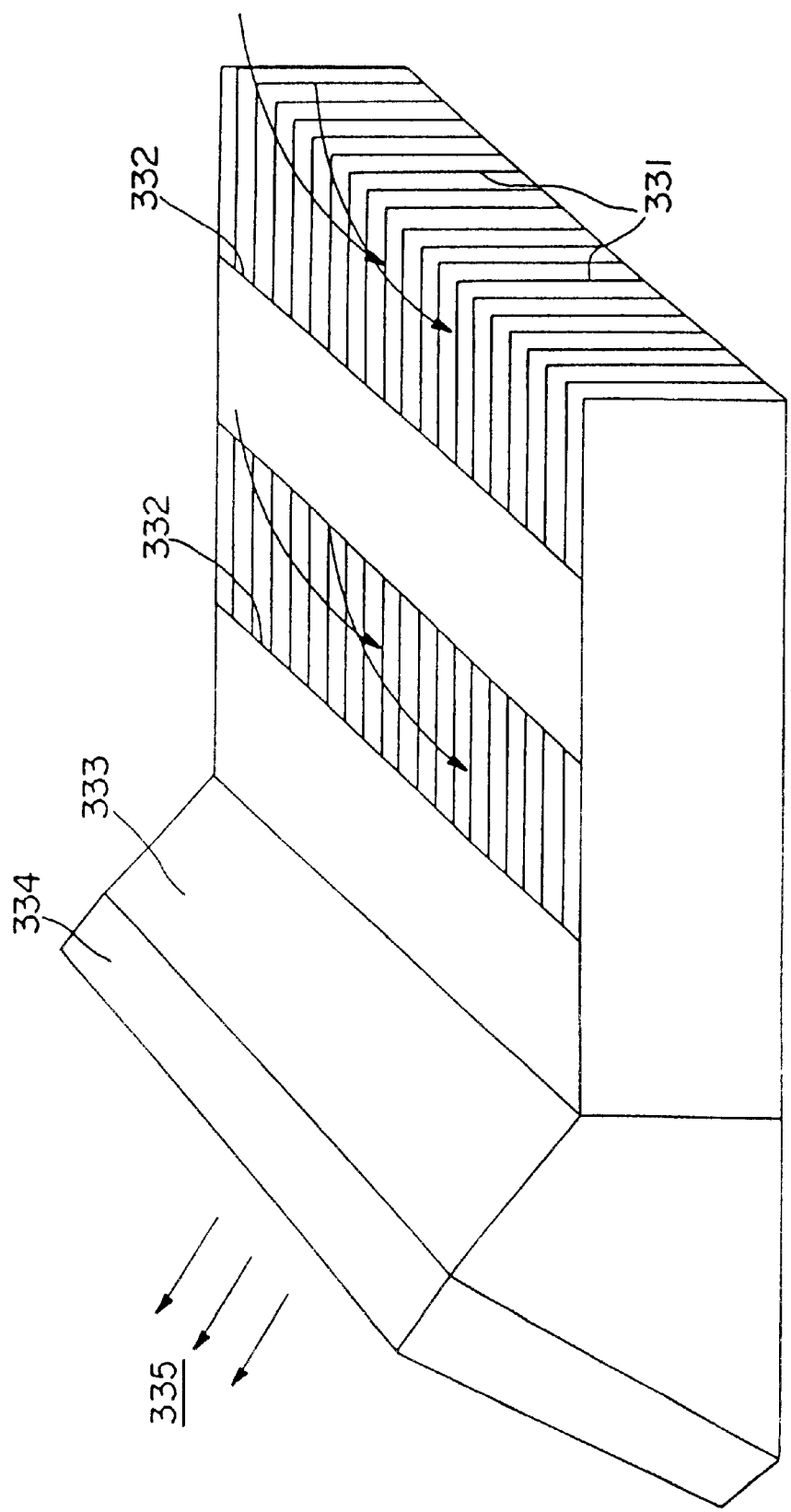

FIG. 33 shows a heat exchanger 330 very similar to FIG. 32, except it has a buffer 333 for accommodating larger size fans in comparison to the heat exchanger 320 illustrated in FIG. 32. The buffer 333 lies between the fan (not shown) and the fin field, and provides for an equalization of the pressure. The buffer 333 allows for the accommodation of more than one fan depending upon the size of the unit. In addition, if the fan is placed too close to an obstruction, the performance of the heat exchanger 330 will be significantly depleted. The purpose of the fan is to make the fluid flow entering the fin field uniform. If the flow is not uniform, this will result in a temperature gradient across the heat exchanger 330. Similar to the heat exchanger illustrated in FIG. 32, the heat exchanger 330 comprises flow guides 332 in the form of transverse bars extending across the width of the heat exchanger 330. The flow guides 332 provide support for the fins as well as provide the ability for the heat exchanger 330 to receive evenly distributed fluid flow. As such, the flow guides 332 guide fresh fluid being drawn into the fin field, as shown at 336, to different parts of the heat exchanger 330. One of the benefits associated with the heat exchanger 330 is the ability to accommodate a large fan or multiple fans, at 334, depending upon the size and dimensions of the unit. Accordingly, the fan provides a source of power for moving fluid at a higher velocity within the fin field and through the heat exchanger by directing fluid flow to exit the front end at 335.

Manufacturing Process

Figure 34:
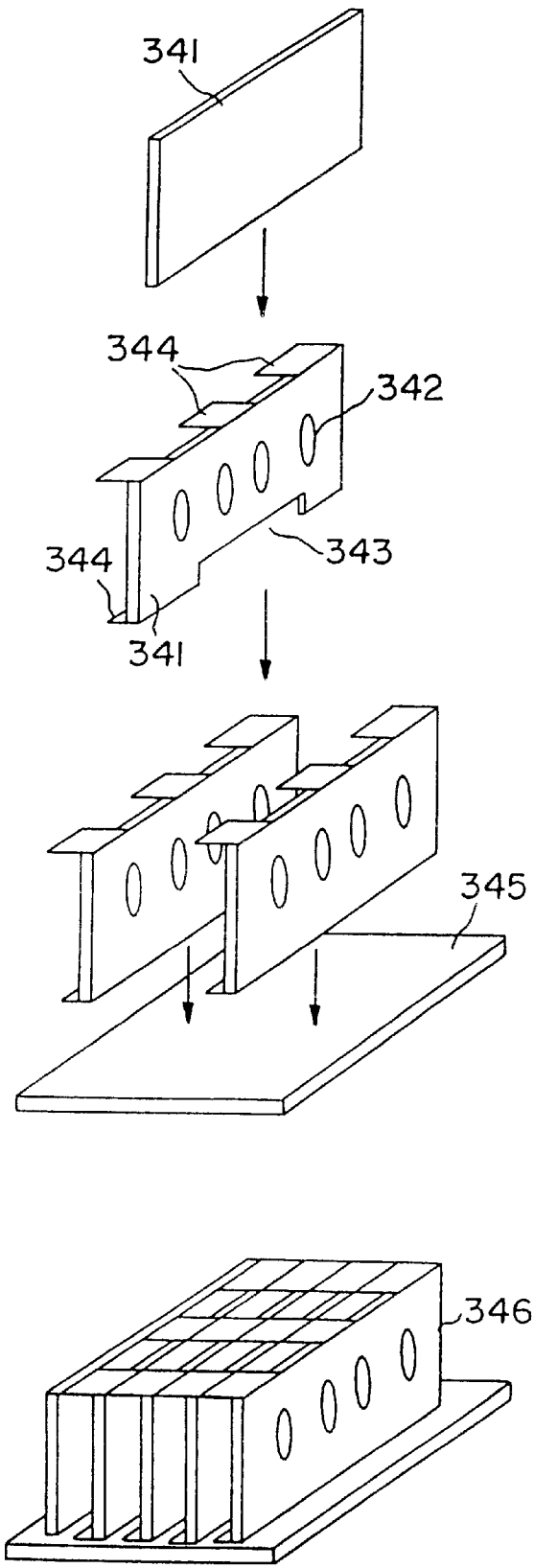
FIG. 34 shows a process of configuring and assembling discrete plate fins.

Creating plate fins configurations of the type described above can be difficult if not impossible using traditional techniques of extrusion, machining, and casting. For this reason, the present invention provides for discrete plate fins that can be individually configured for a particular application before being mounted to a base. FIG. 34 shows an assembly process for the heat exchanger disclosed. First, a properly sized plate fin 341 is cut or otherwise obtained from stock material of aluminum, copper, or any other high-temperature conducting material. Next, the plate fin is modified with surface enhancements. As discussed above, these surface enhancements include orifices 342, to slots 343, texturing, and flow guides. Support plates 344 may be also attached to the top and bottom of the plate fin for securing the plate fin to both the base and the other plate fins. Next, the plate fins are assembled on a base 345. They may be attached using traditional means of gluing, soldering, braising, pressing and heating, or other bonding techniques as well as mechanical connecting techniques such as tongue and groove, tab and slot, hole and dowel and other known means, to form the final assembly 346. Alternatively, the discrete fins may be connected to form an assembly before mounting to the base.

Certain heat exchanger configurations of the present invention may also be manufactured as integral assemblies. To this end, a block of thermally conductive material is machined to define plate fins and channels. This block is then drilled or otherwise machined across the plate fins to produce orifices therethrough. In this way, a heat exchanger is manufactured that has integral plate fins which may be preferable from a manufacturing and structural integrity perspective.

Obviously, numerous modifications and variations of the present invention are possible in the light of the above teachings. It is therefore understood that within the scope of the appended claims, the invention may be practiced otherwise than as specifically described herein.

What is claimed is:

1. A heat exchanger for dissipating heat from a heat generating component, said heat exchanger comprising:
   a thermally conductive base in thermal communication with said component;
   a plurality of thermally conductive plate fins affixed to said base to define a fin field having a top, bottom, and two side plate fins, wherein at least one plate fin within said fin field has a void, and one of said plate fins has at least one slot substantially contiguous with said base; and
   said plate fin having said void having at least one flow guide vane integrally connected to said plate fin at the periphery of said void, wherein said flow guide vane protruding from said plate fin.

2. The heat exchanger of claim 1, further comprising a bar traversing the tops of a portion of said plate fins, said bar exerting a downward force on a portion of fluid within said fin field thereby hampering its premature exit from said fin field.

3. The heat exchanger of claim 2, wherein said bar is selected from the group consisting of a flat bar, a profiled bar, and a profiled bar having at least one point.

4. The heat exchanger of claim 2, wherein said bar is a profiled bar that retards fluid flow above said fin field thereby forming a high pressure region above said fin field that substantially prevents a portion of fluid from prematurely exiting said fin field.

5. The heat exchanger of claim 2, wherein said bar covers a sufficient portion of said top to restrict ingress of fluid creating a near impingement condition.

6. The heat exchanger of claim 2 wherein said bar comprises a series of aligned components, each component being affixed to a discrete plate fin.

7. The heat exchanger of claim 1, further comprising fluid control means in the form of surface anomalies on the surface of said plate fins, said anomalies disrupting the boundary layer along said plate fins causing a reduction in high pressure within said fin field.

8. The heat exchanger of claim 7, wherein said surface anomalies being textured surface regions.

9. The heat exchanger of claim 1, wherein said flow guide vane having a volume substantially equal to said void.

10. A heat exchanger for dissipating heat from a heat generating component, said heat exchanger comprising:
    a thermally conductive base in thermal communication with said component;
    a plurality of thermally conductive plate fins affixed to said base, at least one plate fin having a void; and
    at least one flow guide vane integrally connected to said plate fin at the periphery of said void, said flow guide vane protruding from said plate fin;
    a bar traversing the tops of a portion of said plate fins, said bar exerting a downward force on a portion of fluid within said fin field thereby hampering its premature exit from said fin field; and
    wherein said bar is a profiled bar that retards fluid flow above said fin field thereby forming a high pressure region above said fin field that substantially prevents a portion of fluid from prematurely exiting said fin field.

11. The heat exchanger of claim 10, wherein said bar covers a sufficient portion of said top to restrict ingress of fluid, thereby creating a near impingement condition.

12. The heat exchanger of claim 10, wherein said bar comprises a series of aligned components, each component being affixed to a discrete plate fin.

13. The heat exchanger of claim 10, wherein said flow guide vane having a volume substantially equal to said void.

14. The heat exchanger of claim 10, wherein said plate fins comprising fluid control elements in the form of surface anomalies on the surface of said plate fins, said anomalies disrupting the boundary layer along said plate fins causing a reduction in high pressure within said fin field.

15. The heat exchanger of claim 14, wherein said surface anomalies being textured surface regions.

16. The heat exchanger of claim 10, further comprising fluid control elements for controlling the flow of fluid within said plate fin field and for deterring the formation of high pressure fluid within said fin field.

17. The heat exchanger of claim 16, wherein said fluid control elements being an aperture within said side plate fin substantially contiguous with said base.

18. The heat exchanger of claim 16, wherein said fluid control elements being an aperture within said side plate fin substantially along said base.

19. A heat exchanger for dissipating heat from a heat generating component, said heat exchanger comprising:
    a thermally conductive base in thermal communication with said component;
    a plurality of thermally conductive plate fins affixed to said base to define a fin field having a top, bottom, and two side plate fins, wherein at least one plate fin within said fin field has a void, and one of said plate fins has at least one slot substantially along said base; and
    said plate fin having said void having at least one flow guide vane integrally connected to said plate fin at the periphery of said void, wherein said flow guide vane protruding from said plate fin;
    a bar traversing the tops of a portion of said plate fins, said bar exerting a downward force on a portion of fluid within said fin field thereby hampering its premature exit from said fin field; and
    wherein said bar is a profiled bar that retards fluid flow above said fin field thereby forming a high pressure region above said fin field that substantially prevents a portion of fluid from prematurely exiting said fin field.

20. The heat exchanger of claim 19, wherein said bar covers a sufficient portion of said top to restrict ingress of fluid, thereby creating a near impingement condition.

21. The heat exchanger of claim 19, wherein said bar comprises a series of aligned components, each component being affixed to a discrete plate fin.

22. The heat exchanger of claim 19, wherein said flow guide vane having a volume substantially equal to said void.

23. The heat exchanger of claim 19, wherein said plate fins comprising fluid control elements in the form of surface anomalies on the surface of said plate fins, said anomalies disrupting the boundary layer along said plate fins causing a reduction in high pressure within said fin field.

24. The heat exchanger of claim 19, wherein said surface anomalies being textured surface regions.

25. The heat exchanger of claim 19, further comprising fluid control elements for controlling the flow of fluid within said plate fin field and for deterring the formation of high pressure fluid within said fin field.

26. The heat exchanger of claim 25, wherein said fluid control elements being an aperture within said side plate fin substantially contiguous with said base.

* * * * *